(12) United States Patent
Cooke

(10) Patent No.: US 9,823,689 B2
(45) Date of Patent: Nov. 21, 2017

(54) VARIABLE CLOCKED SERIAL ARRAY PROCESSOR

(71) Applicant: Laurence H. Cooke, Los Gatos, CA (US)

(72) Inventor: Laurence H. Cooke, Los Gatos, CA (US)

(*) Notice: Subject to any disclaimer, the term of this patent is extended or adjusted under 35 U.S.C. 154(b) by 69 days.

(21) Appl. No.: 15/092,114

(22) Filed: Apr. 6, 2016

(65) Prior Publication Data

US 2016/0216727 A1    Jul. 28, 2016

Related U.S. Application Data

(60) Division of application No. 14/100,344, filed on Dec. 9, 2013, now Pat. No. 9,329,621, which is a continuation of application No. 12/699,548, filed on Feb. 3, 2010, now Pat. No. 8,656,143, which is a continuation-in-part of application No. 11/374,790, filed on Mar. 13, 2006, now abandoned.

(51) Int. Cl.
| | |
|---|---|
| *G06F 1/12* | (2006.01) |
| *G06F 9/30* | (2006.01) |
| *G06F 15/78* | (2006.01) |
| *G06F 15/80* | (2006.01) |
| *G11C 11/405* | (2006.01) |
| *G06F 1/06* | (2006.01) |

(52) U.S. Cl.
CPC .............. *G06F 1/12* (2013.01); *G06F 1/06* (2013.01); *G06F 9/30014* (2013.01); *G06F 9/30032* (2013.01); *G06F 15/7867* (2013.01); *G06F 15/8015* (2013.01); *G11C 11/405* (2013.01)

(58) Field of Classification Search
None
See application file for complete search history.

(56) References Cited

U.S. PATENT DOCUMENTS

| | | |
|---|---|---|
| 3,979,728 A | 9/1976 | Reddaway |
| 4,473,878 A | 9/1984 | Zolnowsky et al. |
| 5,179,714 A | 1/1993 | Graybill |
| 5,289,429 A | 2/1994 | Watanabe |
| 5,379,444 A | 1/1995 | Mumme |
| 5,418,969 A | 5/1995 | Matsuzaki et al. |
| 5,600,582 A | 2/1997 | Miyaguchi |
| 5,659,776 A | 8/1997 | Chauvel |
| 5,694,588 A | 12/1997 | Ohara et al. |
| 5,822,608 A | 10/1998 | Dieffenderfer et al. |
| 5,864,706 A | 1/1999 | Kurokawa et al. |
| 5,956,274 A | 9/1999 | Elliott et al. |
| 5,970,254 A | 10/1999 | Cooke et al. |
| 6,205,533 B1 | 3/2001 | Margolus |
| 6,691,288 B1 * | 2/2004 | Fakhry ............... G06F 17/5022 703/15 |
| 6,985,547 B2 | 1/2006 | Uht |
| 7,042,296 B2 | 5/2006 | Hui et al. |

(Continued)

*Primary Examiner* — William B Partridge
(74) *Attorney, Agent, or Firm* — Panitch Schwarze Belisario & Nadel LLP

(57) ABSTRACT

A serial array processor may have an execution unit, which is comprised of a multiplicity of single bit arithmetic logic units (ALUs), and which may perform parallel operations on a subset of all the words in memory by serially accessing and processing them, one bit at a time, while an instruction unit of the processor is pre-fetching the next instruction, a word at a time, in a manner orthogonal to the execution unit.

6 Claims, 22 Drawing Sheets

(56) References Cited

U.S. PATENT DOCUMENTS

| | | |
|---|---|---|
| 7,555,084 B2 | 6/2009 | Uht |
| 2002/0059197 A1 | 5/2002 | Hunter et al. |
| 2002/0158700 A1 | 10/2002 | Nemoto |
| 2002/0188882 A1 | 12/2002 | Thomas et al. |
| 2003/0200237 A1 | 10/2003 | Naoi |
| 2004/0254965 A1 | 12/2004 | Giernalczyk et al. |
| 2005/0125597 A1 | 6/2005 | Lovett |
| 2006/0033544 A1 | 2/2006 | Hui et al. |
| 2006/0107083 A1 | 5/2006 | Brown |
| 2006/0212247 A1* | 9/2006 | Shimoyama .......... G06F 1/3203 702/89 |
| 2008/0141199 A1* | 6/2008 | Bargfrede ........... G06F 17/5031 716/108 |
| 2008/0162824 A1 | 7/2008 | Jalowiecki et al. |
| 2012/0047478 A1* | 2/2012 | Ge ..................... G06F 17/5031 716/108 |
| 2012/0304136 A1* | 11/2012 | Ge ..................... G06F 17/5068 716/108 |

\* cited by examiner

VARIABLE CLOCKED SERIAL ARRAY PROCESSOR

CROSS-REFERENCE TO RELATED APPLICATIONS

This application is a divisional of U.S. patent application Ser. No. 14/100,344, filed Dec. 9, 2013, which is a continuation of U.S. patent application Ser. No. 12/699,548, filed Feb. 3, 2010, which is a continuation-in-part of U.S. patent application Ser. No. 11/374,790, filed Mar. 13, 2006, now abandoned, both of which are hereby incorporated by reference in their entireties.

FIELD OF THE INVENTION

The present invention pertains to single instruction, multiple data processors, serial processing, re-configurable processing and orthogonal memory structures.

BACKGROUND OF THE INVENTION

Numerous examples of single instruction, single data path processors exist. Intel™ MIPS™, ARM™ and IBM™ all produce well-known versions of these types of processors. In recent years, in the continuing push for higher performance, these standard processors have grown to include multiple execution units with individual copies of the registers and out-of-order instruction processing to maximize the use of the multiple execution units. In addition, many of these processors have increased the depth of their instruction pipelines. As a result, most the execution units become underutilized when the processing becomes serialized by load stalls or branches. In addition, much of the computational capability of these execution units, which have grown from 16 to 32 and on up to 64 bits per word, is wasted when the required precision of the computation is significantly less than the size of the words processed.

On the other hand, array processor architectures also exist. CDC™ and later SGI™ produced notable versions of these types of computers. They consist of a single instruction unit and multiple execution units that all perform the same series of functions according to the instructions. While they are much larger than single instruction, single execution processors, they can also perform many more operations per second as long as the algorithms applied to them are highly parallel, but their execution is highly homogeneous, in that all the execution units perform the same task, with the same limited data flow options.

On the other side of the computing spectrum there exist re-configurable compute engines such as described in U.S. Pat. No. 5,970,254, granted Oct. 19, 1999 to Cooke, Phillips, and Wong. This architecture is standard single instruction, single execution unit processing mixed with Field Programmable Gate Array (FPGA) routing structures that interconnect one or more Arithmetic Logic Units (ALUs) together, which allow for a nearly infinite variety of data path structures to speed up the inner loop computation. Unfortunately the highly variable, heterogeneous nature of the programmable routing structure requires a large amount of uncompressed data to be loaded into the device when changes to the data path are needed. So while they are faster than traditional processors the large data requirements for their routing structures limit their usefulness.

This disclosure presents a new processor architecture, which takes a fundamentally different approach to minimize the amount of logic required while maximizing the parallel nature of most computation, resulting in a small processor with high computational capabilities.

SUMMARY OF EMBODIMENTS OF THE INVENTION

Serial computation has all of the advantages that these parallel data processing architectures lack. It takes very few gates, and only needs to process for as many cycles as the precision of the data requires. For example FIG. 1 shows the logic for a serial one-bit adder 10. It can require as little as 29 Complimentary Metal Oxide Silicon (CMOS) transistors to implement. It takes only N+1 clock cycles to generate a sum 12, least order bit first, of the two N bit numbers 11, also least order bit first. As shown in FIG. 2, multiple copies 20 may be strung together to produce a multiplier, which, when preloaded with the multiplier 21, serially produces the product 22 of the serially inputted multiplicand 23 in 2N+1 cycles, also least order bit first.

Even smaller structures may be created to serially compare two numbers as shown in FIG. 3, or swap two numbers as shown in FIG. 4. As such, all of these functions and logic operations such as AND, OR, NOT and XOR (exclusive or) may be combined into a compact serial Arithmetic Logic Unit (ALU) 53 such as shown in FIG. 5, and easily replicated into an array processor's execution unit.

This disclosure describes a way to simultaneously address and route multiple words of data to multiple copies of such serial ALUs by accessing multiple words of data one bit at a time, and serially stepping through the computation for as many bits as the precision of the computation requires. The instructions may be accessed out of a two-port memory, one word at a time, which is orthogonal and simultaneous to the data being accessing. The serial computation may take multiple clock cycles to complete, which is sufficient time to access and generate all the masked addresses necessary to configure the array for the next computation.

Furthermore, a dynamically re-configurable option is also presented which increases the flexibility of the processing while minimizing the amount of configuration data that needs to be loaded.

In addition, options are presented to selectively separate or combine the instruction memory from the data memory thereby doubling the density of the available memory, while providing communication between the instruction unit and the execution unit to do the necessary address calculations for subsequent processing.

The capability to logically combine multiple masked address decodes gives the instruction unit the configuration flexibility to route data from selected read memory addresses to selected ALUs and back to selected write memory addresses with complete flexibility.

A conditional configuration option is also presented to select between one of a number of sets of masked decoded address data thereby eliminating the delay when processing one or more conditional operations. Unlike deeper pipelined processors, such an option is sufficient, since the subsequent configuration may be conditionally loaded based on the prior compare results while the current conditional operation is being performed.

Furthermore, because of the configurable nature of the serial data paths, resulting in a wide variation in the time required to execute a cycle of an operation, a timing structure and a variety of timing techniques are presented to minimize the execution time of each operation.

Lastly, another structure combining two columns of ALUs and Memories with circular routing capability is presented.

BRIEF DESCRIPTION OF THE DRAWINGS

The invention will now be described in connection with the attached drawings, in which.

DESCRIPTION OF VARIOUS EMBODIMENTS

Embodiments of the present invention are now described with reference to FIG. 1-FIG. 22, it being appreciated that the figures illustrate various aspects of the subject matter and may not be to scale or to measure.

A preferred embodiment of the present invention is an array processor, which utilizes a two port orthogonal memory to simultaneously access configuration instructions and their associated addresses in a serial fashion while serially processing data, one bit at a time through an array of execution units.

Figure 6:
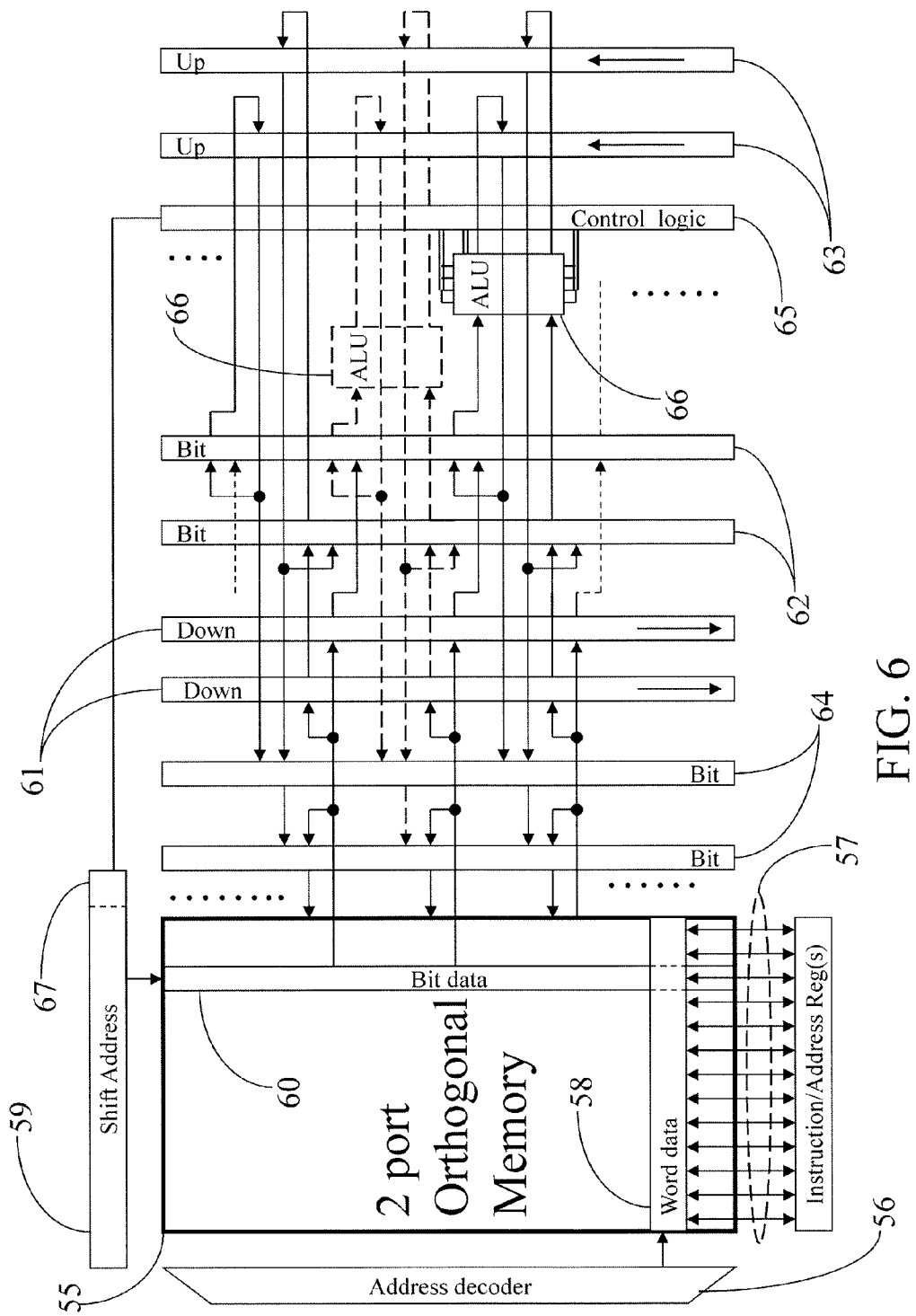
FIG. 6 is a diagram of the array processor's execution unit.

Reference is now made to FIG. 6, a diagram of the memory and the execution unit of the serial array processor. The orthogonal memory 55 has two modes of accessing data; a word at a time by applying an address to a traditional decoder 56, which reads or writes all the bits 57 of a selected word address 58 in parallel, or a bit of every word at a time by a circular shift register 59 selecting a bit 60 out of each word of the memory 55 to read or write. All the bits may be selected in successive clock cycles in order from the least order bit to the highest order bit by shifting the circular shift register 59. In the configuration shown in FIG. 6, each bit value from the memory is selected by the latches of 8 address registers 61-64 to be routed either back to the memory 55 or through an ALU 66, which is set up to perform a specific function through the control logic 65. Two address registers 61, labeled "down," select the bit values 60 outputted from the memory 55 to propagate down through their circular string of multiplexors. Two other address registers 63, labeled "up," select bits to either pass through or propagate up through their multiplexors. Another two address registers 62, select between the propagated bits and either transfer them directly into the set of up multiplexors in address registers 63, or put them into an ALU 66, in which case the outputs of ALU 66 are put into the up multiplexors of address registers 63. The latches of the last two address registers 64 select between the bit values propagated through the up multiplexors by the latches of address registers 63 and the original contents of the memory, to be written back into the addressed bits 60 in the memory 55.

Any number of ALUs 66 may be present up to one ALU 66 per word address. Each ALU 66 receives data either from two successive addresses in memory 55 or from the down multiplexors in address registers 61, and outputs their results to each of the up multiplexors in address registers 63. With this structure any number of words in memory 55 may be accessed in parallel, transferring each bit of each word to the nearest ALU below the accessed word, and propagating the output from each ALU to any ALU or memory address above it. An extra bit 67 exists on the circular shift register 59 to provide a clock cycle at the beginning of each serial operation to set the ALU control logic 65 and update the latches in address registers 61-64.

Figures 7, 8, 9:
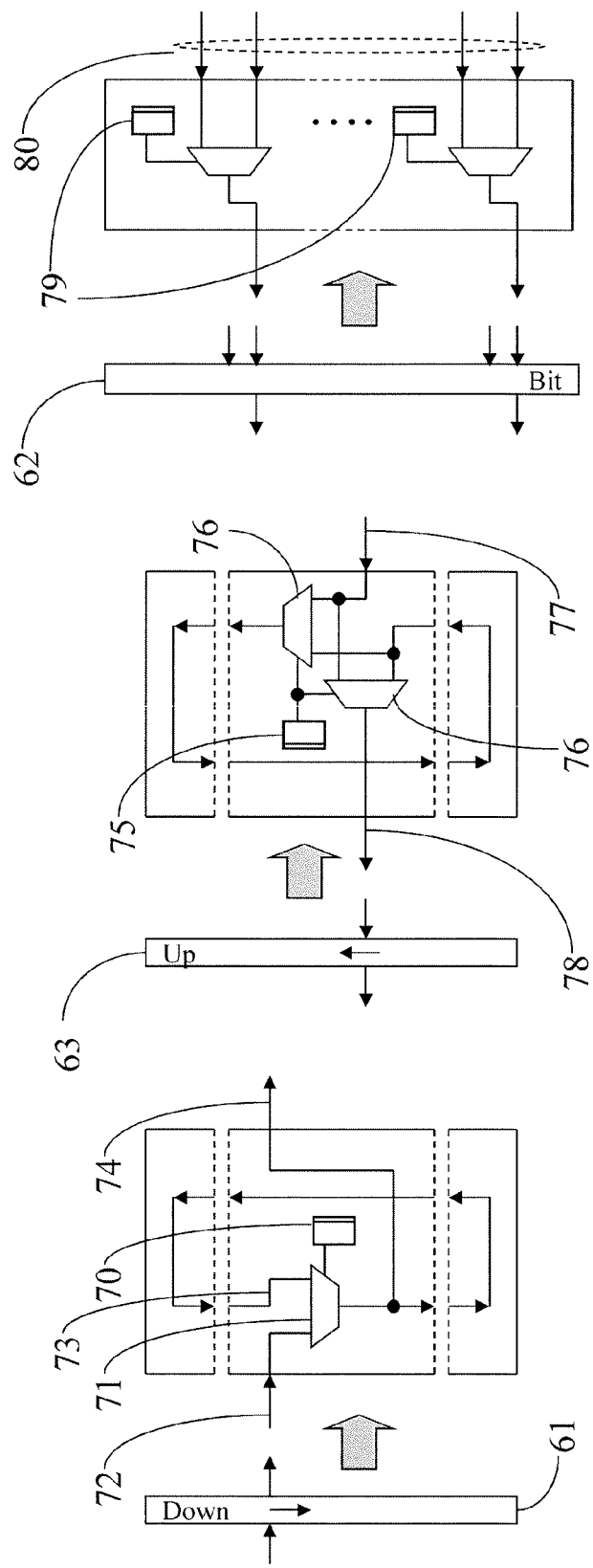
FIG. 7, FIG. 8 and FIG. 9 are detailed diagrams of the address registers.

Reference is now made to FIG. 7, FIG. 8 and FIG. 9, the detailed diagrams of the address registers in FIG. 6. Each of these registers has at least one latch per bit serial word outputted from the memory, which is used to control the selection of the bit of data at that address. The diagram in FIG. 7 shows one bit and the ends of a down address register. Each latch 70 controls a multiplexor 71, which either selects the inputted bit 72 to propagate down, or continues the propagation of a bit 73 from an address above it. The last selected bit is available on the output 74 of each address location. The diagram in FIG. 8 shows the two ends and a bit of an up address register. In this case the latch 75 controls two multiplexors 76, which either make the inputted bit 77 available on the output 78, passing over the propagated bit, or output the propagated bit and begin propagating the inputted bit. The diagram in FIG. 9 shows two bits of the address registers 62 and 64, in FIG. 6. The latch 79 selects between two inputted bits 80 for each address.

As can be seen by the structures described in FIG. 6, FIG. 7, FIG. 8 and FIG. 9, the control logic and address registers may generally be configured prior to each operation in order to apply that operation across the entire memory in the intended manner.

Figure 10:
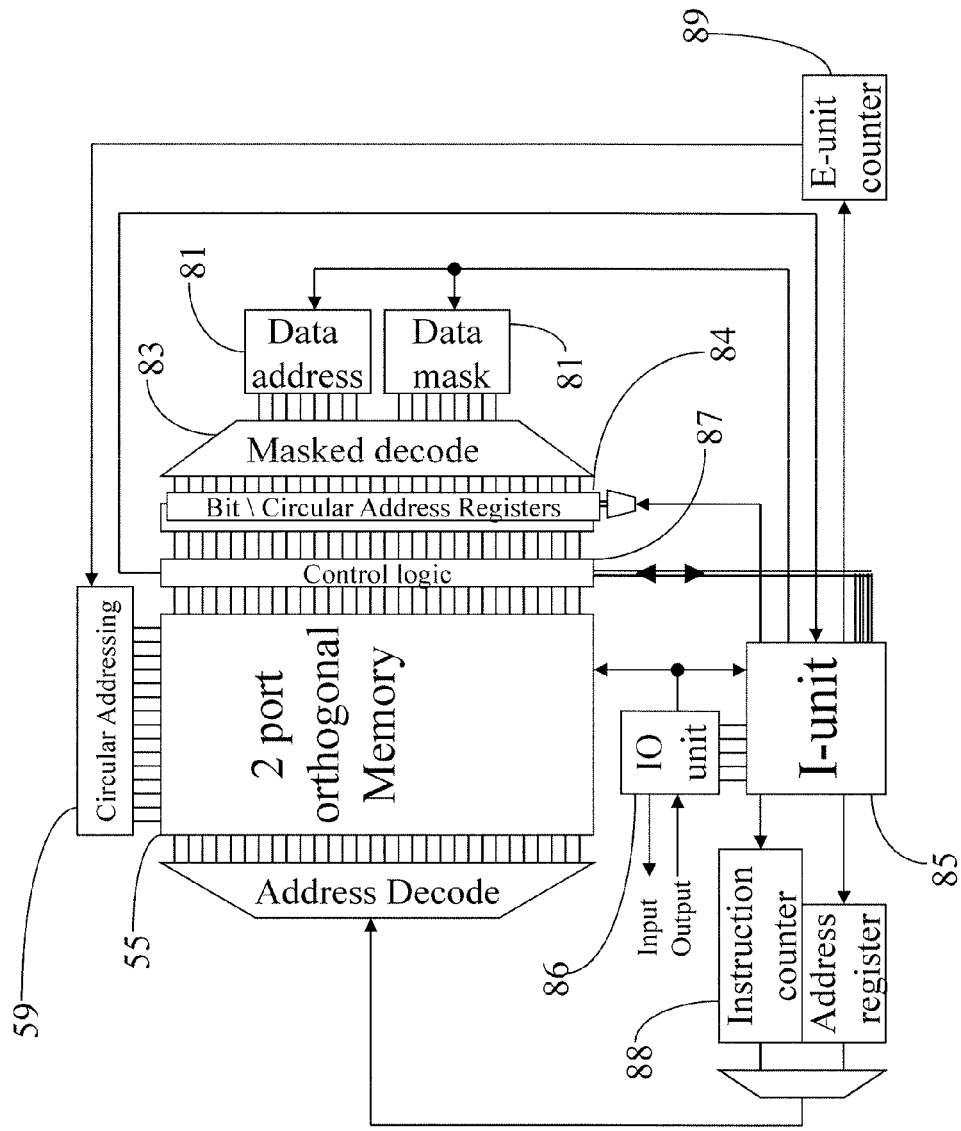
FIG. 10 is a diagram of the array processor's configuration instruction logic.

Reference is now made to FIG. 10, a diagram of the instruction unit controls for the serial array processor. Configuration instructions are read from memory by addressing memory 55 with the instruction counter 88. The configuration instructions contain operation code, target identification, Address and Mask fields. The I-unit 85 processes a configuration instruction by first placing information from the address and mask fields into the data Address and data mask registers 81, and then decoding by a masked decode 83 and storing the decoded results in the appropriate address register 84, defined by the value in the target identification field. Prior to the start of each operation, one or more configuration instructions are processed over successive clock cycles, until all address registers are configured. Input and Output (I/O) is independently written or read into the memory 55 by the I/O unit 86 either directly in parallel, or serially from and/or to external inputs and outputs. The specific ALU functions defined in the target identification field of the appropriate configuration instruction may be loaded into the ALUs through the control logic 87. For less than full word computation, the E-unit counter 89 may be set by the I-unit 85, from an execution instruction such that it resets the circular shift address register 59, prior to addressing all the columns in the memory.

Figure 12:
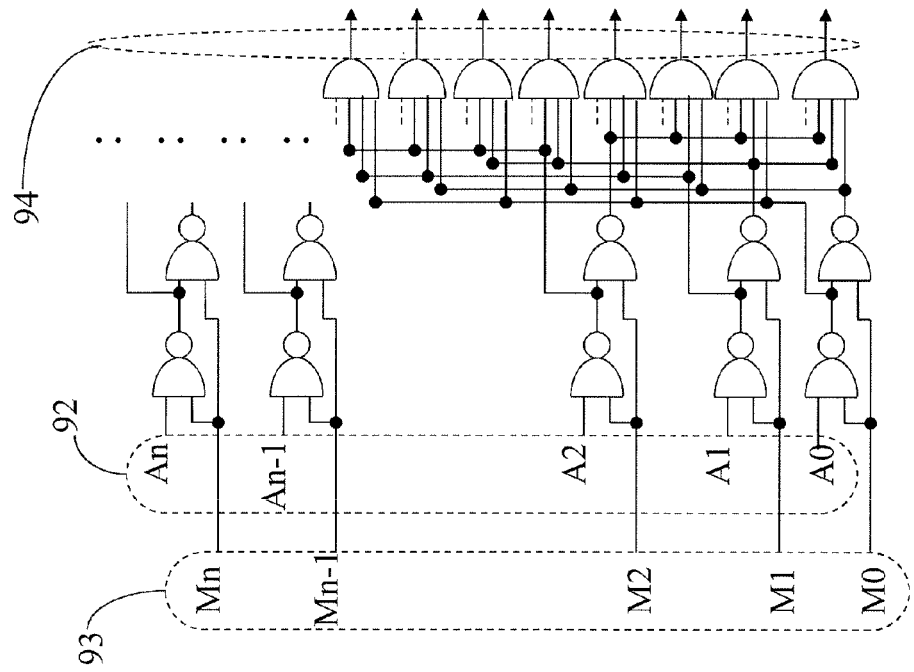
FIG. 11 and FIG. 12 are diagrams of decoders.
Figure 11:
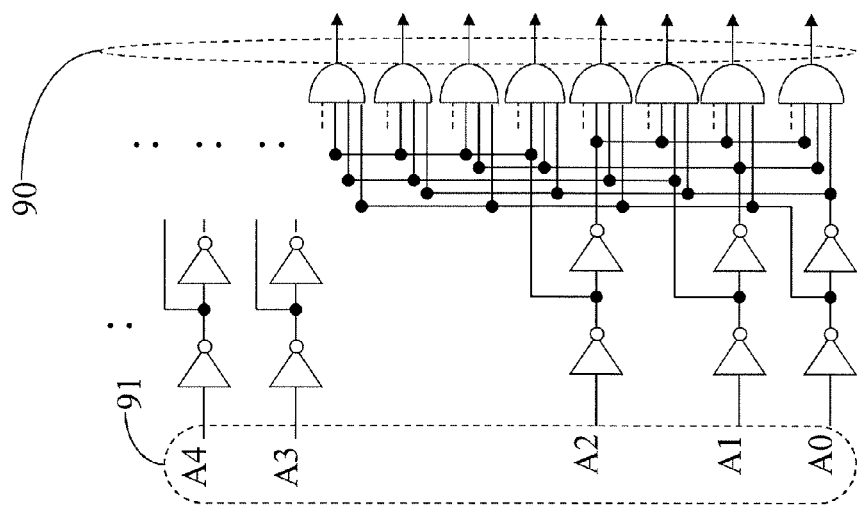

Reference is now made to FIG. 11 and FIG. 12, diagrams of address decoders. FIG. 11 shows a traditional address decoder, such as 56 shown in FIG. 10. It sets one of its outputs 90 high and the rest low for any specific combination of inputs 91. By contrast, FIG. 12 is a diagram of the masked decode 83 shown in FIG. 10. It contains both address inputs 92 and mask inputs 93, and sets all outputs 94 high whose addresses are equivalent to the address inputs 92 when both are ANDed with the complement of the mask inputs 93. In this fashion blocks of addresses may be selected to set up multiple serial operations to execute in parallel.

Figure 14:
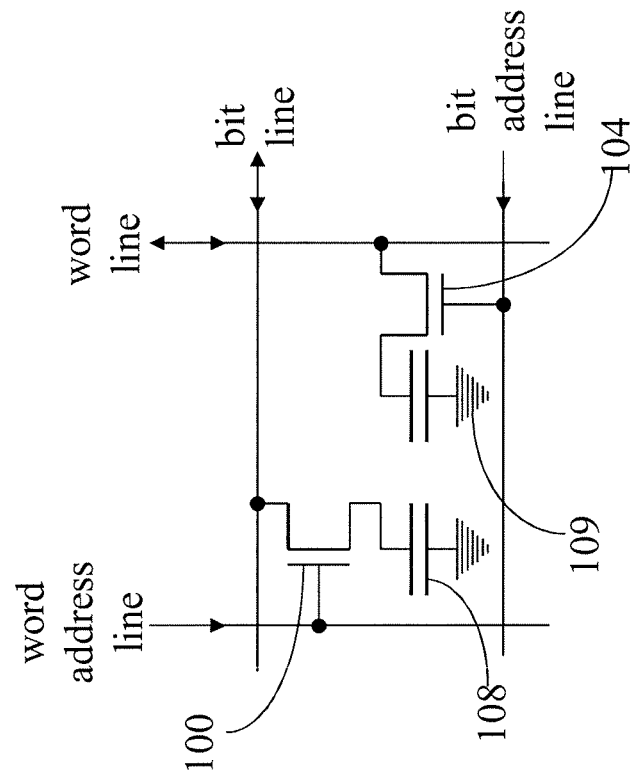
FIG. 13, FIG. 14 and FIG. 15 are diagrams of two port orthogonal memory cells.
Figure 13:
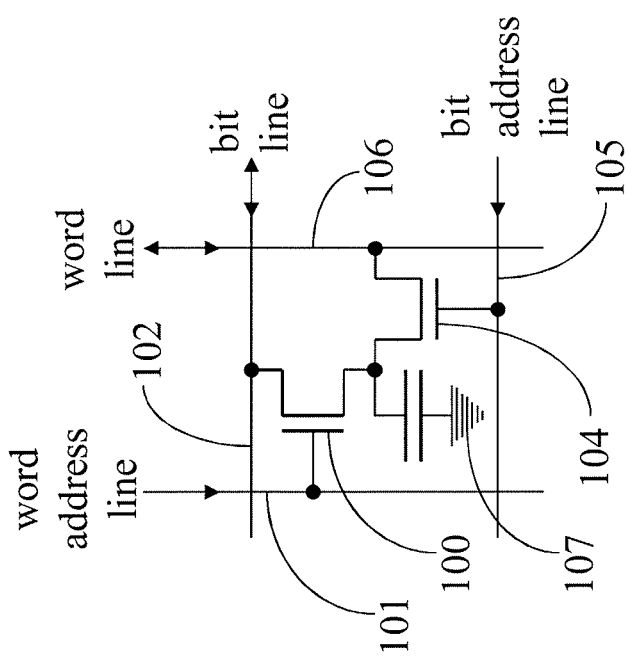
Figure 15:
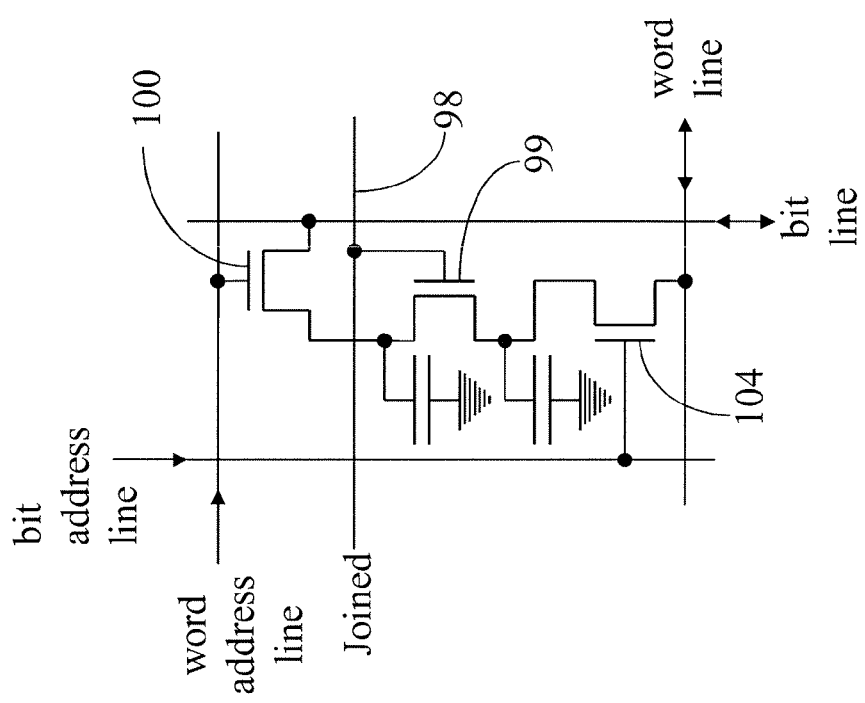

Reference is now made to FIG. 13, FIG. 14 and FIG. 15, diagrams of possible constructions of the memory cells in the two port orthogonal memory 55 shown in FIG. 6. FIG. 13 shows a Dynamic Random Access Memory (DRAM) structure, where one transistor 100 is selected by the appropriate word address line 101 to read or write all the bits in a word on bit lines 102, while perpendicular to the first, a second transistor 104 is selected by the appropriate bit address line 105 to read or write a single bit in all the words on their word lines 106. In this case both transistors 101 and 104 access the same grounded capacitor 106. This allows simultaneous access of both configuration instructions and data in a fashion most appropriate for their processing, and in spite of its small size, it is almost twice as large as a single bit of single port DRAM. While some amount of overlapping memory is appropriate so the execution units may create addresses and masks for subsequent configuration instructions, this overlap may be limited to a predefined set of address locations, and all other memory cells may be structured such as shown in FIG. 14, where each transistor reads and writes its own capacitor 108 and 109, such that they appear to be two completely separate memories for that set of words. In this fashion the two-port orthogonal memory may contain separate program and data in one block of words and combined program/data values in another block of words. The size of the combined block of words may then be limited to the memory that must be used by both the I-unit and the execution units thus minimizing the memory overhead of such communication.

Unfortunately, the amount of combined memory may not always be well defined enough to create a two port orthogonal memory with fixed blocks of combined and separate memory structures, but this may be addressed with the addition of a single transistor 99 between the other two transistors 100 and 104, which joins the two cells together, as shown in FIG. 15. When the joined word line 98 is high, it acts as a combined memory cell, and when the joined word line 98 is low it acts as two separate memory cells. A separate address register, configured by an address and mask such as loaded into the masked decode 82 shown in FIG. 10 may be used to set the joined word lines 98 over the necessary block of words for any particular application.

Reference is again made to FIG. 5, a diagram of an ALU 53. In order to perform one of a number of different functions, some of which are shown in FIG. 1 through FIG. 4, one may need to set or clear a number of control inputs 50 at various cycles throughout the execution. Typically these are driven by the I-Unit 85 through the control logic 87 shown in FIG. 10. Similarly, the control outputs 51, typically the results of a comparison, are captured by the control logic and also used to control the inputs 54 of subsequent operations such as the swap operation. For versions of the serial array processor that contain a large number of ALUs 53, this translation may involve either a large amount of logic or a large amount of wiring. Furthermore to allow each of the ALUs to perform a different function, each ALU 53 must be separately addressed for each possible function. This may require more sets of address registers such as seen in FIG. 7, FIG. 8 or FIG. 9.

In another embodiment of the present invention, the Arithmetic Logic Units may be individually configurable, and configured prior to each operation from data residing in separate address registers.

Figure 17:
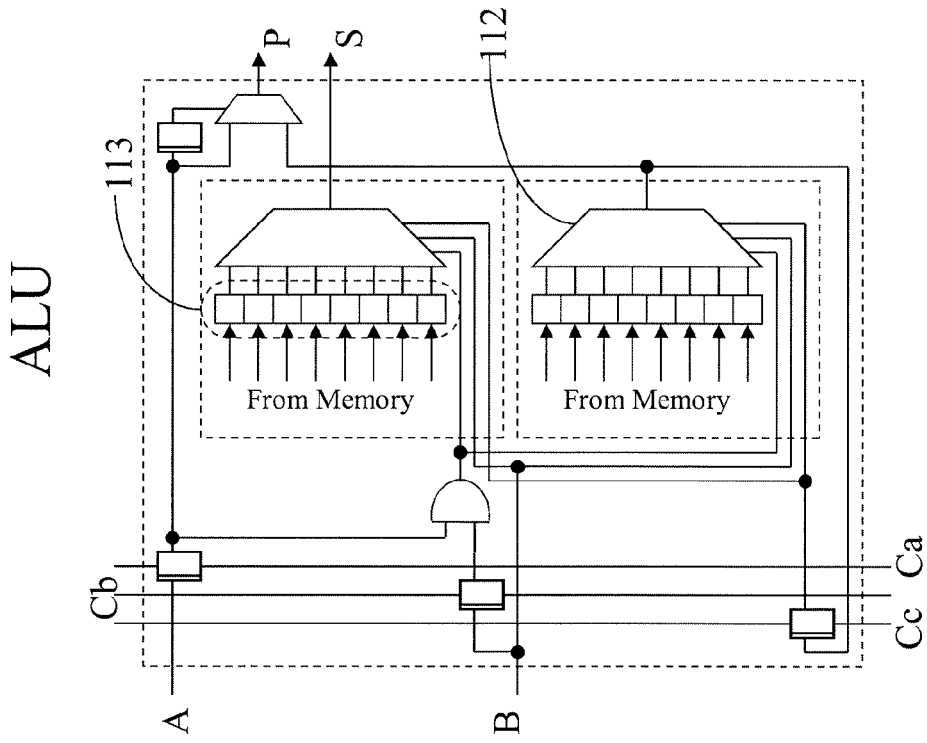
FIG. 16 and FIG. 17 are diagrams of configurable execution units.
Figure 16:
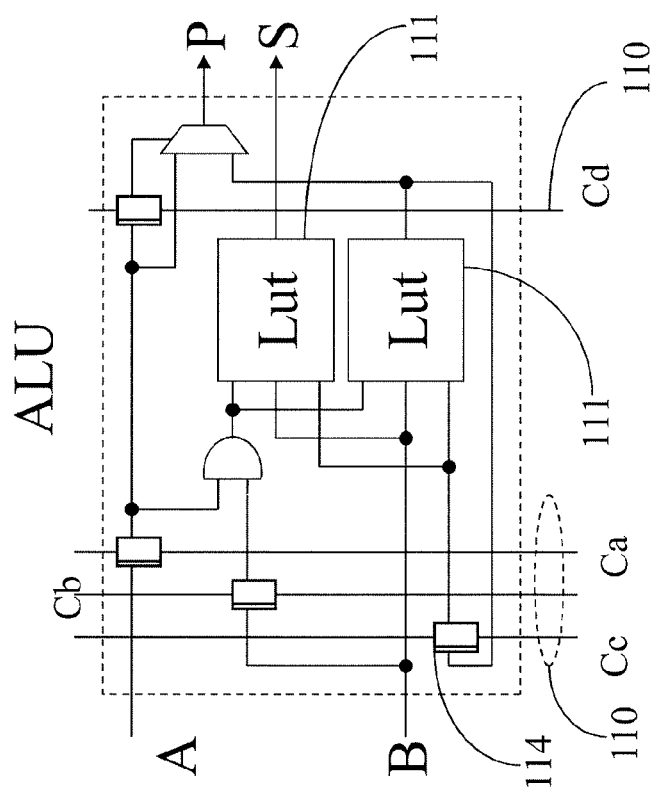

Reference is now made to FIG. 16 and FIG. 17, diagrams of a configurable ALU. In this case the control logic is limited to four clocks or clock enable lines 110 which control latches 114 and 115 to capture, hold or propagate input values to the two three-input look-up tables 111 in the ALU. Look-up table 111 further consists of a 3-to-8 select 112 and eight storage elements 113, which may be loaded from memory to perform a variety of different functions.

Figure 18:
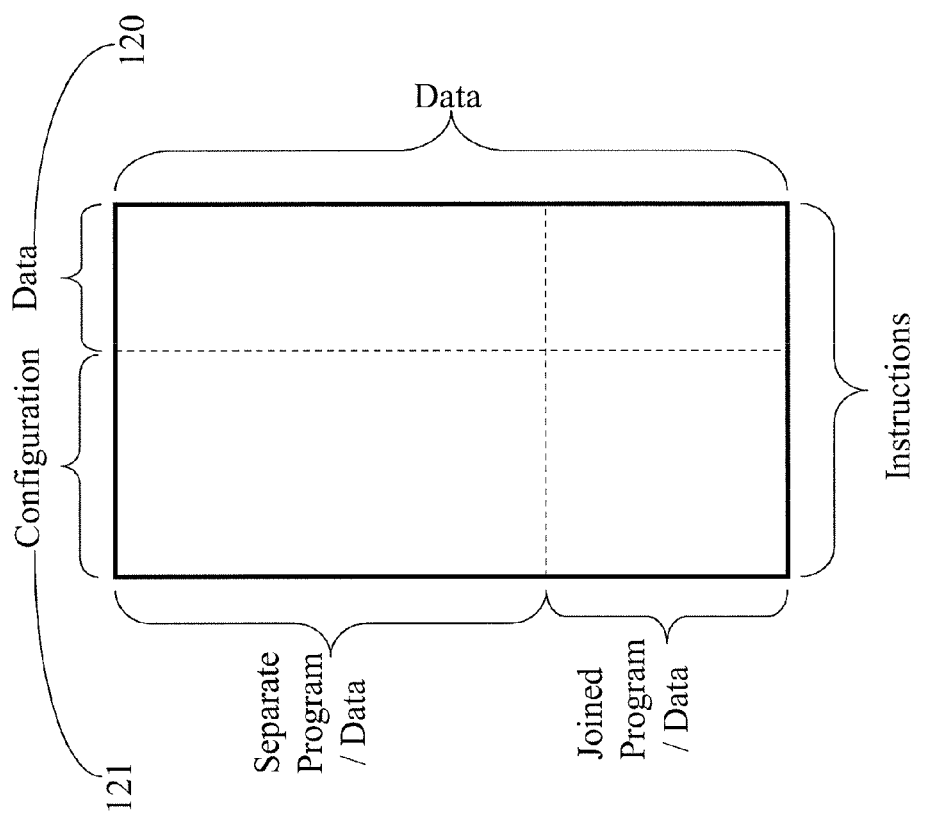
FIG. 18 is a diagram of the use of a two port orthogonal memory.

Reference is now made to FIG. 18, a diagram of one exemplary memory configuration. In this configuration, the data 120 only fills part of each word of memory. The rest of each word may be filled with look-up table configuration information 121. In the set of possible configurations of the array processor having at most one ALU for every 16 words of memory, every 16 bits out of a column of bits in the two port orthogonal memory may be loaded into one configurable ALU such that all ALUs may be configured during the clock cycle when no data is addressed. Alternatively, the configuration information may reside in a separate memory, or one or more configurations of memory may reside in a word of memory which is loaded into the ALUs addressed in the same fashion as the address registers 84 in FIG. 10 are addressed.

Figure 19:
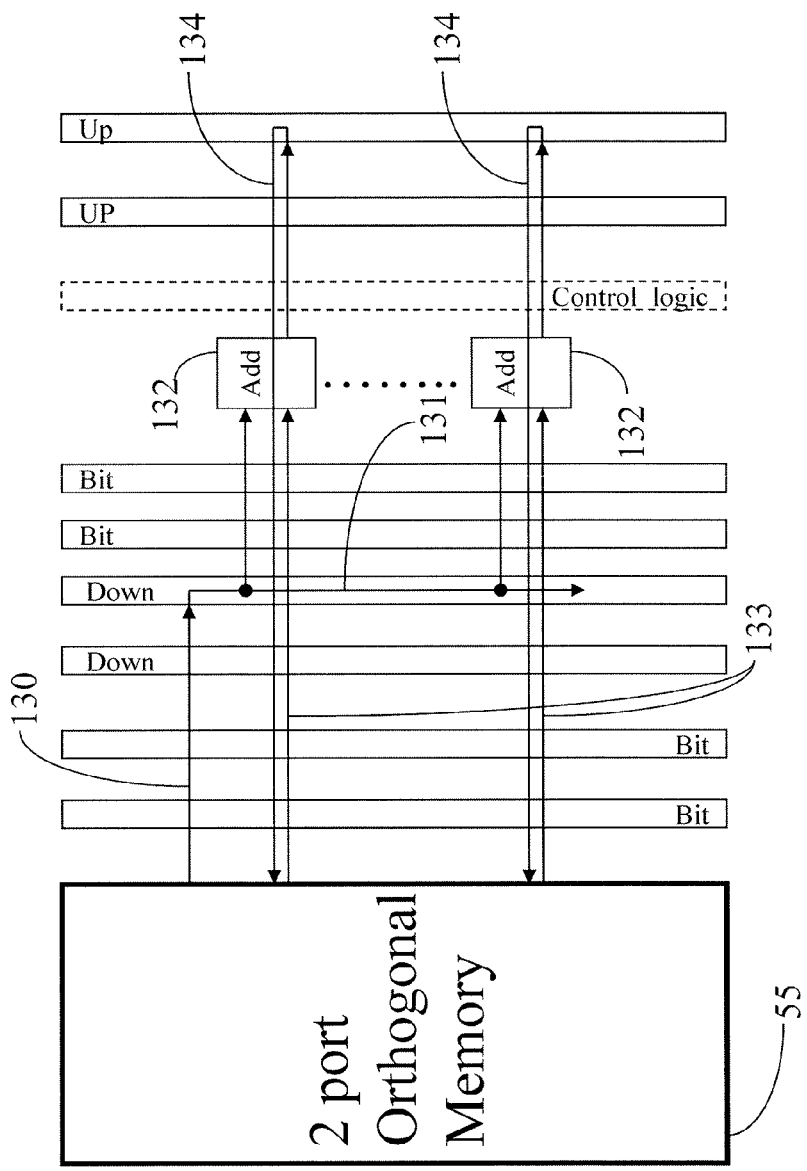
FIG. 19 is a diagram of an array add operation.

Reference is now made to FIG. 19, an example of adding a value to an array of values. An output 130 of the memory 55 is propagated down 131 and is inputted into each of the ALUs 132 in the array. The word 133 at each ALU 132 location is also inputted into that ALU. The sum of the two inputted bits is outputted 134 back into the memory 55, replacing the outputted value. In this fashion a single value may be simultaneously added to M values in an array. A traditional processor would take around K*M cycles, where K is between 2 and 5 instructions per Addition, and M is the number of elements in the array. In this processor it only takes N+1 cycles where N is the number of bits in the words being added. As such this array processor is much faster than a traditional processor when M is larger than N.

Figure 20:
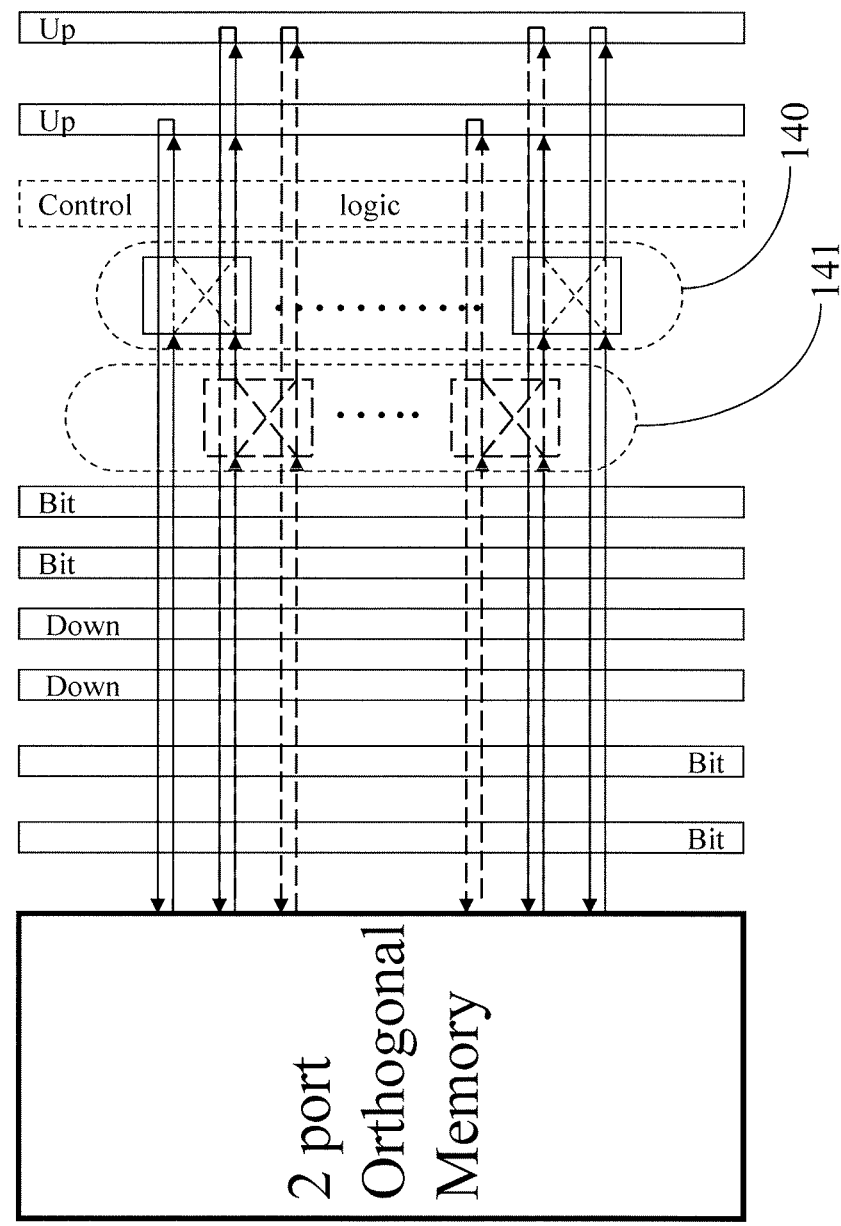
FIG. 20 is a diagram of an array compare and swap operations.

Reference is now made to FIG. 20, an example of compare and swap operations on an array. These configurations are used to sort an array of values. The first compare selects every word in the array to be compared by half the ALUs 140 in the execution unit. After N cycles the latches 52 in FIG. 5 indicate which word is larger. In the next swap configuration, the state of these latches are used to either put each word back where it came from or swap them. This also takes N cycles. In order to properly sort the array, the next compare and swap uses the other half of the ALUs 141. In this fashion, by repeating these compare and swap operations such that M swaps have taken place, an array of M values may be sorted. The number of cycles to accomplish this is at worst 2M*(N+1). By comparison the worst case of the fastest sort in a traditional processor is on the order of K*M², generally slower when M>N, because K is almost always greater than 2. On the other hand, this approach requires the existence of one ALU for every two words of memory.

Figure 21:
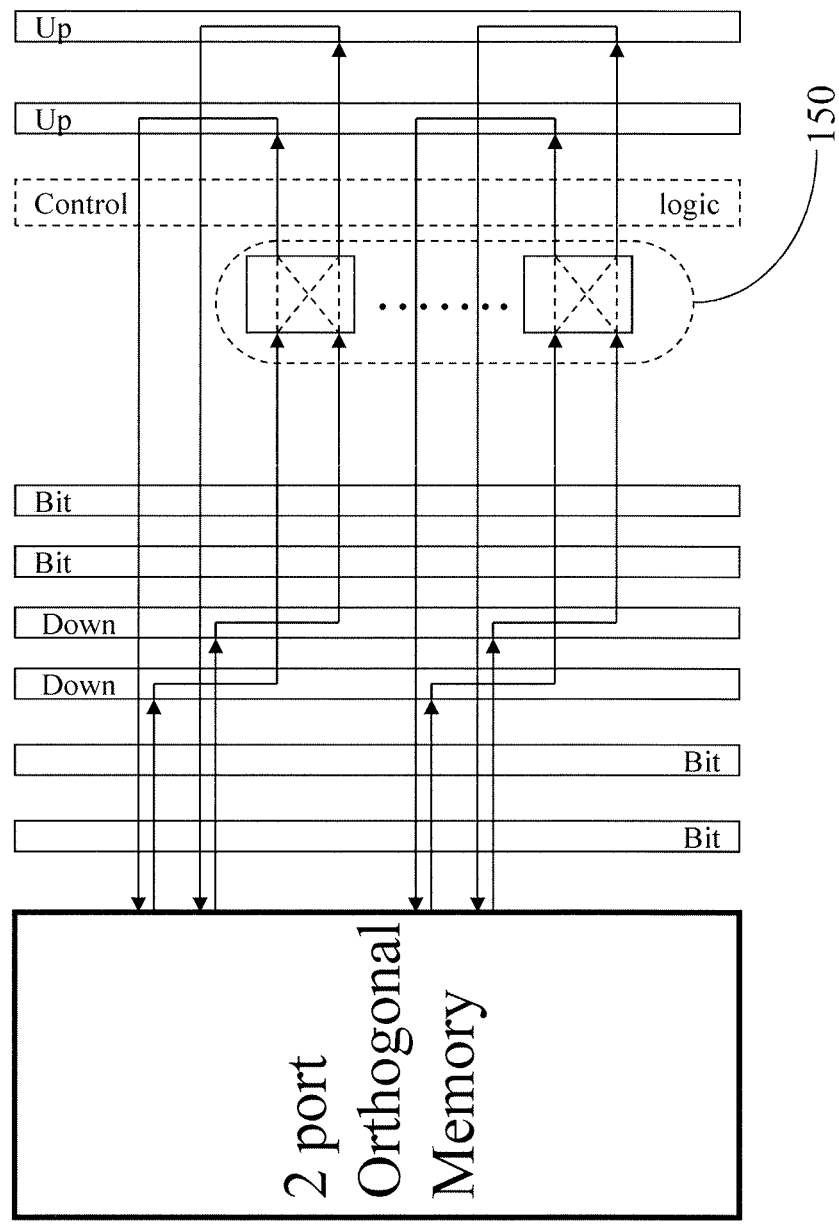
FIG. 21 is another diagram of compare and swap operations.

Reference is now made to FIG. 21, another example of a compare and swap operation. In this case fewer than one ALU for every two words of memory may be used by configuring the array to shift the contents of memory locations to the available ALUs. While potentially slower than the previous example, the result may still be faster than traditional computation given large enough values of M.

Figure 22:
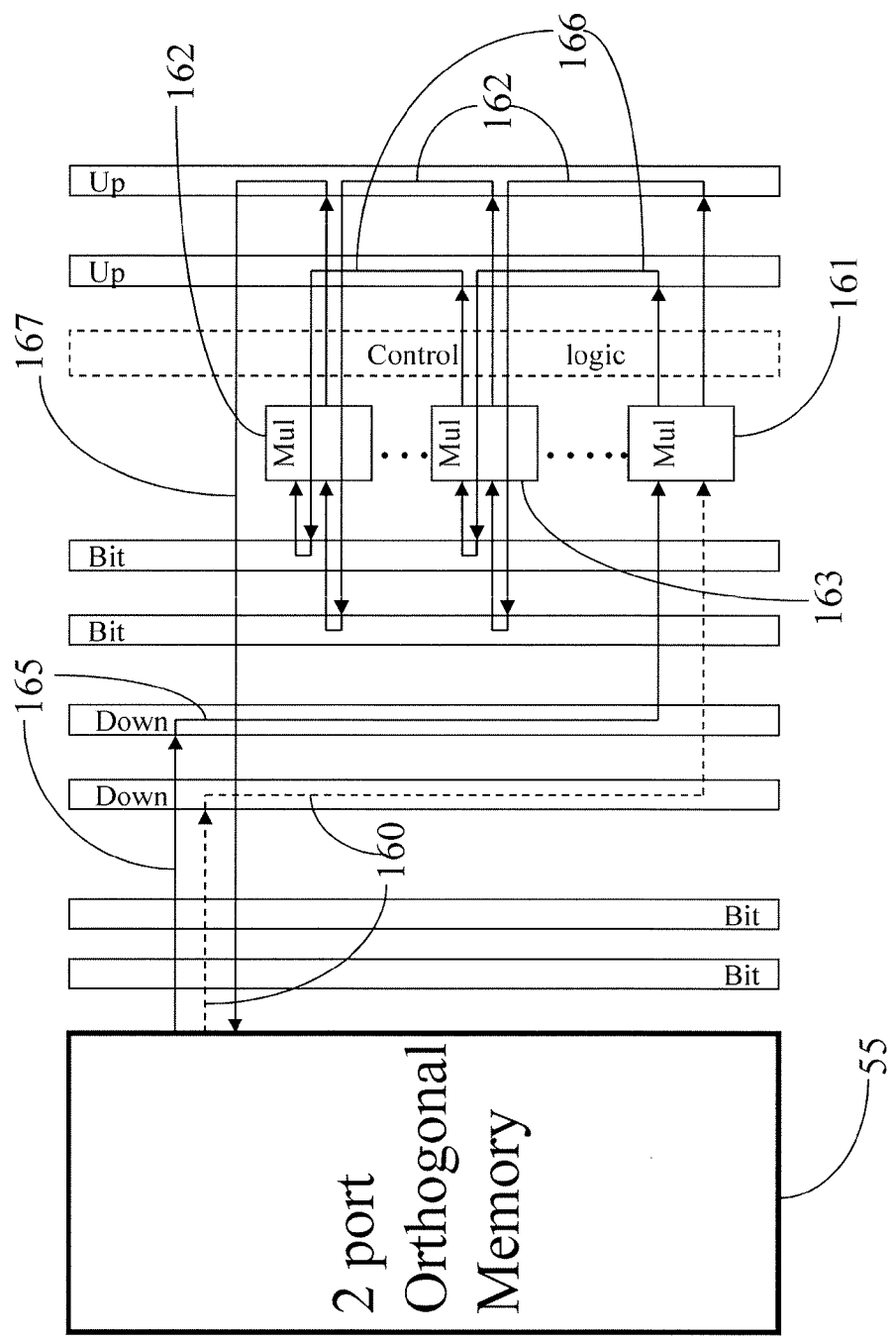
FIG. 22 is a diagram of a multiply operation.

Reference is now made to FIG. 22, an example of a multiply instruction. In this case, during the first N+1 cycles a path is selected 160 for the multiplier to be loaded into the first ALU 161 and through the sum path 162 to the rest of the ALUs 163 and 164. In the next 2N+1 cycles a path for the multiplicand is selected 165 such that on each successive clock cycle the bits of the multiplicand are shifted through the first ALU 161 and through the second path 166 to the rest of the ALUs 163 and 164. A path 167 is also selected during these 2N+1 cycles to output the product from the last ALU 162 back into the memory 55. Clearly it takes N ALUs to produce a 2N bit product. If there are only N bits in the multiplicand, zeros must be inserted into the multiplicand path 165 for the last N+1 cycles of the multiply. In this fashion, it is clear that it would take 3N+2 clock cycles to complete a single multiply using N ALUs. As such, J multiplies, each using N ALUs may be executed in parallel, providing J*N is less than or equal to the number of ALUs in the execution unit.

In each of the above examples it should be noted that some paths are much longer than others. For example, the path 130 in FIG. 19 may span a large number of addresses, and path 166 in FIG. 22 spans a large number of ALUs when N is large. By contrast the paths in FIG. 20 are quite short. In a traditional synchronous processor the clock cycle is designed to ensure signal propagation through the longest path occurs within a single cycle. If such clocks are adjusted, as described by Hui et al. in U.S. Pat. No. 7,042,296, they are adjusted for process, temperature and voltage, not variations in path delay due to different configurations. In this processor the longest possible configured path may be many times the delay of the shortest configured path, which would make a fixed clock cycle, even one that is process, temperature and voltage compensated, particularly wasteful on short path executions.

In another embodiment of the present invention, the clocks of the processor may be derived from a counter, clocked by an oscillator, which may be created using an inverting circular delay line, whose base frequency may be adjusted to compensate for the process, temperature and voltage variations of the processor. The execution path of each instruction may then be calculated or measured to determine the proper setting for the counter so that the execution unit clocks, which are nominally the base frequency divided by the setting of the counter, only provide as much time as needed to complete each serial step of the specific operation.

A delay model of the execution unit may be included within a compiler for the serial array processor. Using nominal process, voltage and temperature, the model may then be used to simulate each compiled operation and generate a count that determines the clock cycle timing for the configured execution unit, which may then be included in one of the execution unit configuration instructions. These counts are loaded, at the beginning of each execution unit operation, to define the frequency of the execution unit clocks for that operation.

Alternatively a measurement of the actual execution unit's delay may be performed after it is set up for an operation but prior to the execution of the operation. The measured value, some division of a base clock frequency, may be stored in the I unit, and then used to generate the execution unit's clock frequency for the execution of the subsequent operation.

Figure 23:
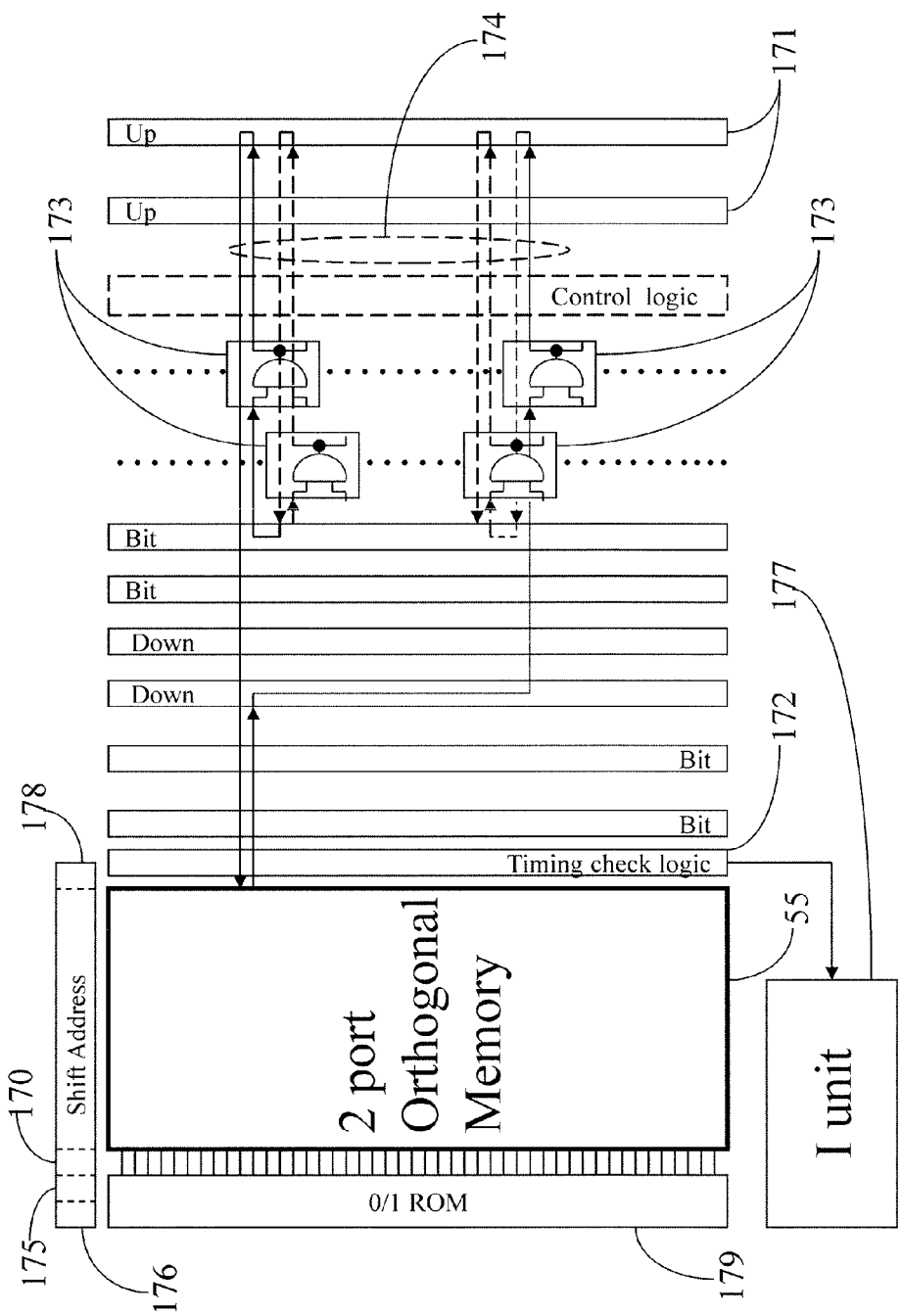
FIG. 23 is a diagram of the execution unit with timing check logic.
Figure 24:
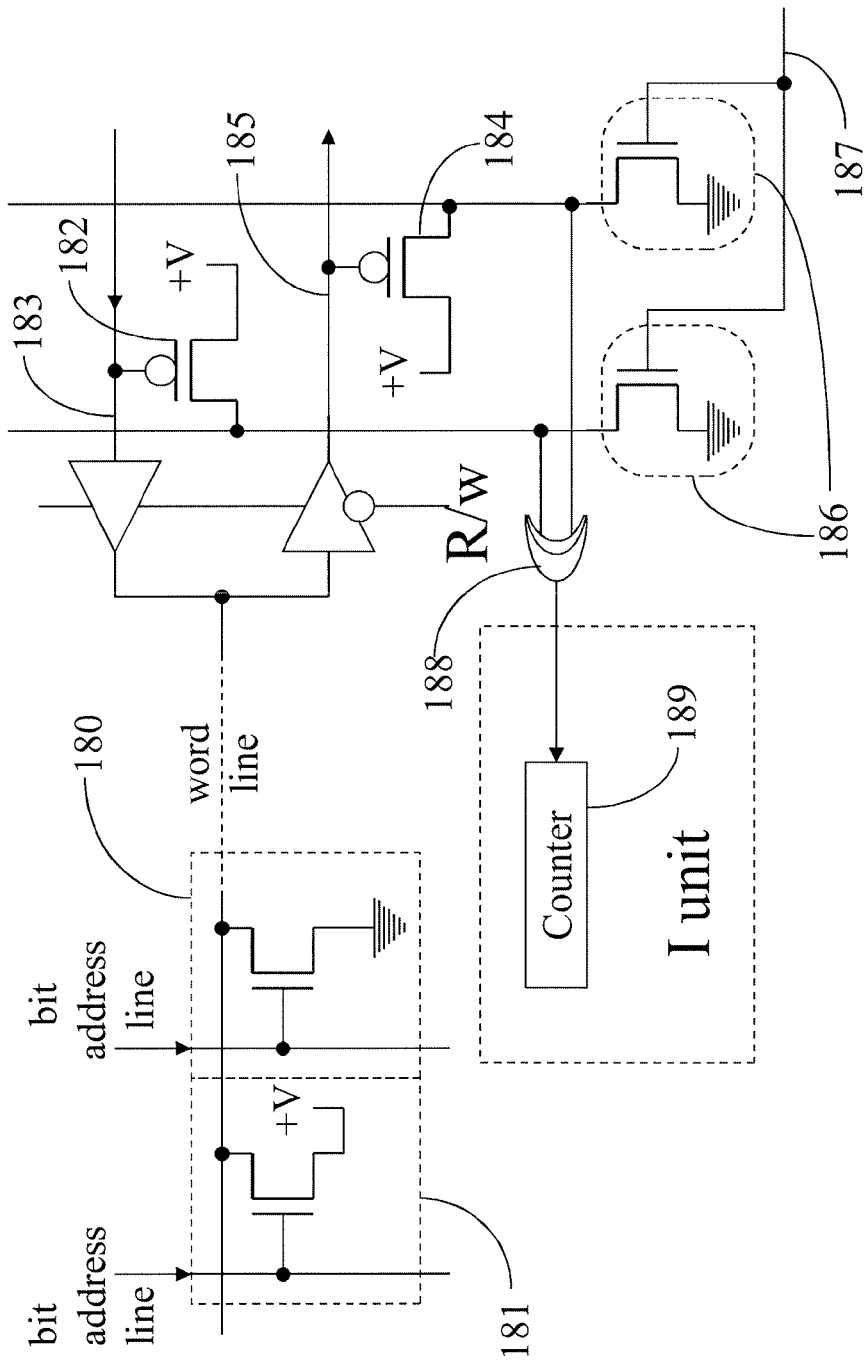
FIG. 24 is a diagram of the timing check logic

Reference is now made to FIG. 23, an example of an execution unit with timing check logic. At the completion of executing an operation, the circular shift register's reset bit 170 is set, at which time the address registers 171 are set with the new operation's paths. For an execution unit with timing check logic 172, the ALUs 173 are configured as AND functions of all the inputs to all the outputs. The next cycle of the circular shift register 175, the first timing cycle, loads 0s from the 0/1 ROM 179 into all the selected paths. On these timing clock cycles, the maximum count for the I unit's counter 189 in FIG. 24, is used. This generates the lowest clock frequency (longest execution unit clock cycle) possible. The long clock cycle delay guarantees the propagation of all signals. The next timing cycle of the circular shift register 176 selects all 1s from the 0/1 ROM 179, which then propagate through the paths 174 and ALUs 173, and back to the memory 55. Prior to entering the memory the positive transition is detected by the timing check logic 172, which is sent to the I unit 177, to generate the count for the execution unit's clock frequency during the next operation. On the next cycle, the first cycle of the next operation, a second reset bit 178 of the circular shift register is selected and the ALUs are changed to their correct functions to begin the next serial operation.

Reference is now made to FIG. 24, the details of a bit of the timing check and Read only Memory (ROM). Each ROM word consists of a zero bit 180 followed by a one bit 181. The timing check logic consists of a strings of P-channel transistors 182 tied to the memory inputs 183, and a string of P-channel transistors 184 tied to the memory outputs 185, which are tied down by N-channel transistors 186 when their gates lines 187 are enabled. This propagates two 1s into the exclusive or (XOR) gate 188, which disables the counter 189 until all the memory outputs 185 transition high, after which the counter is enabled until the inputs 183 all transition high and two 0s on the XOR gate 188 inputs disable the counter 189. At the end of this timing clock cycle the counter 189, contains the base clock frequency divider for the next execution unit operation. The same temperature and process compensated oscillator, which may be used to generate the base clock for this count, may then be used to generate the execution unit's clocks.

Figure 1:
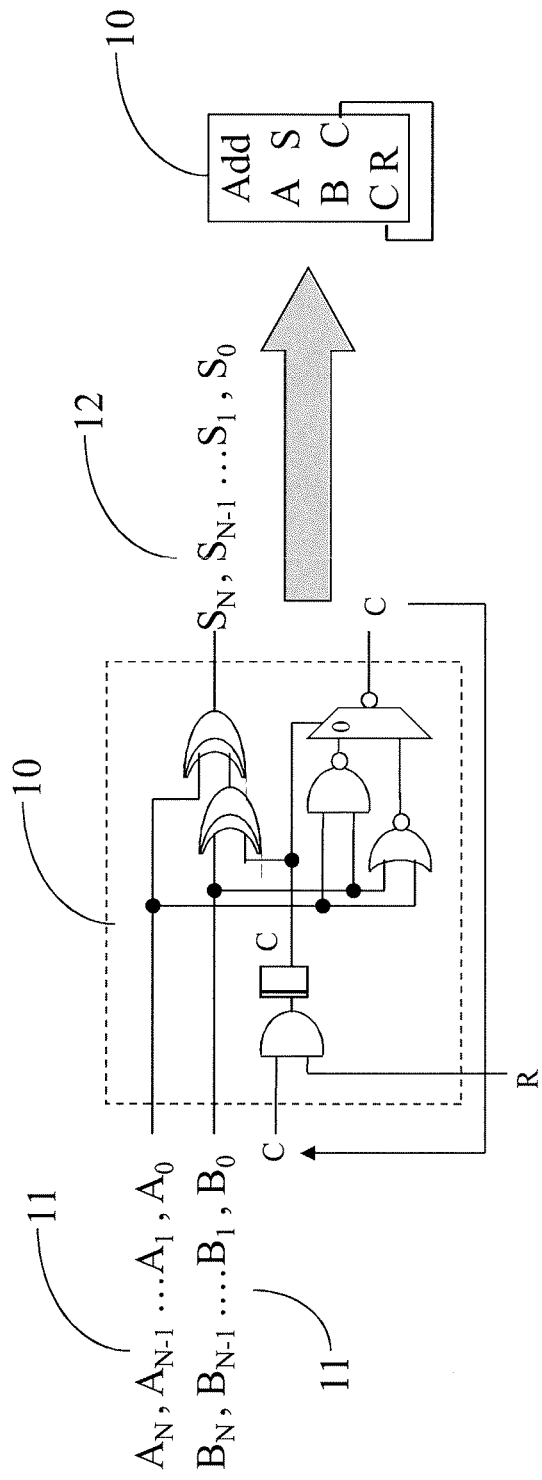
FIG. 1 is a diagram of a single bit serial adder.
Figure 2:
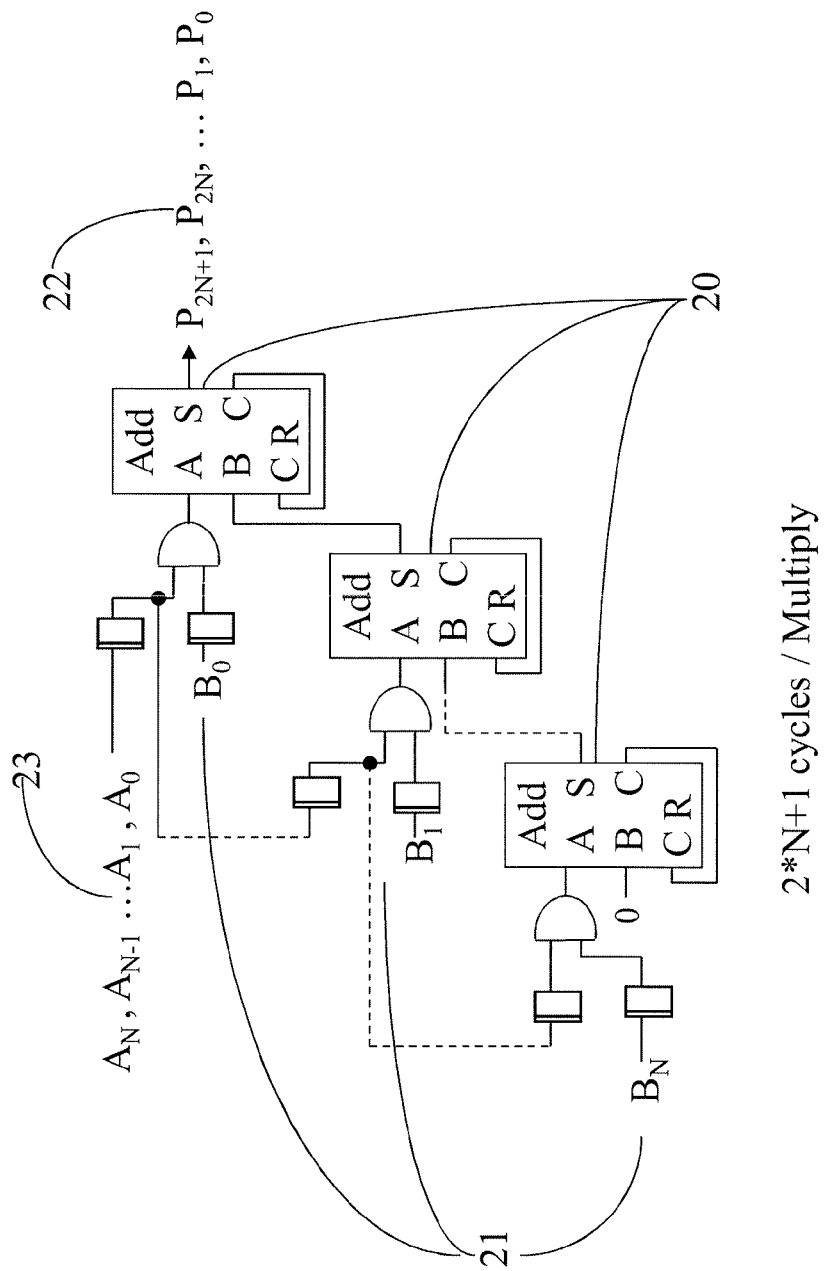
FIG. 2 is a diagram of a single bit serial multiplier.
Figure 3:
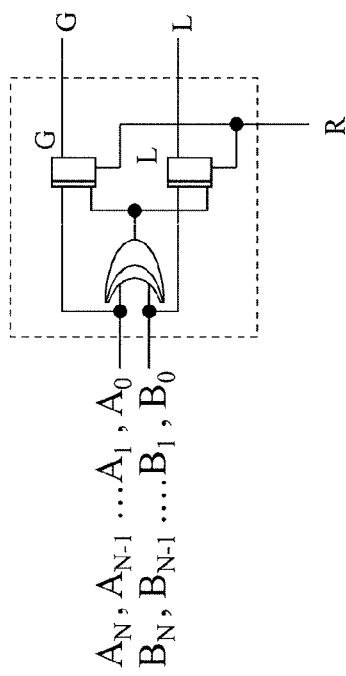
FIG. 3 is a diagram of a serial compare.
Figure 4:
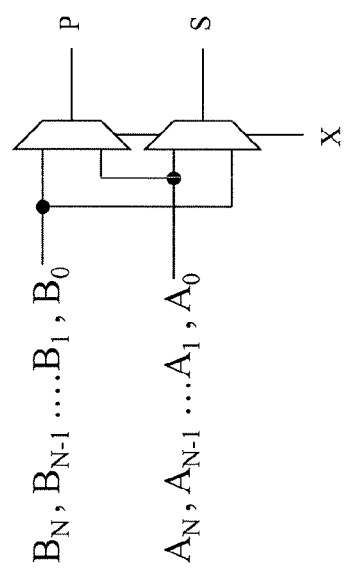
FIG. 4 is a diagram of a serial swap.
Figure 5:
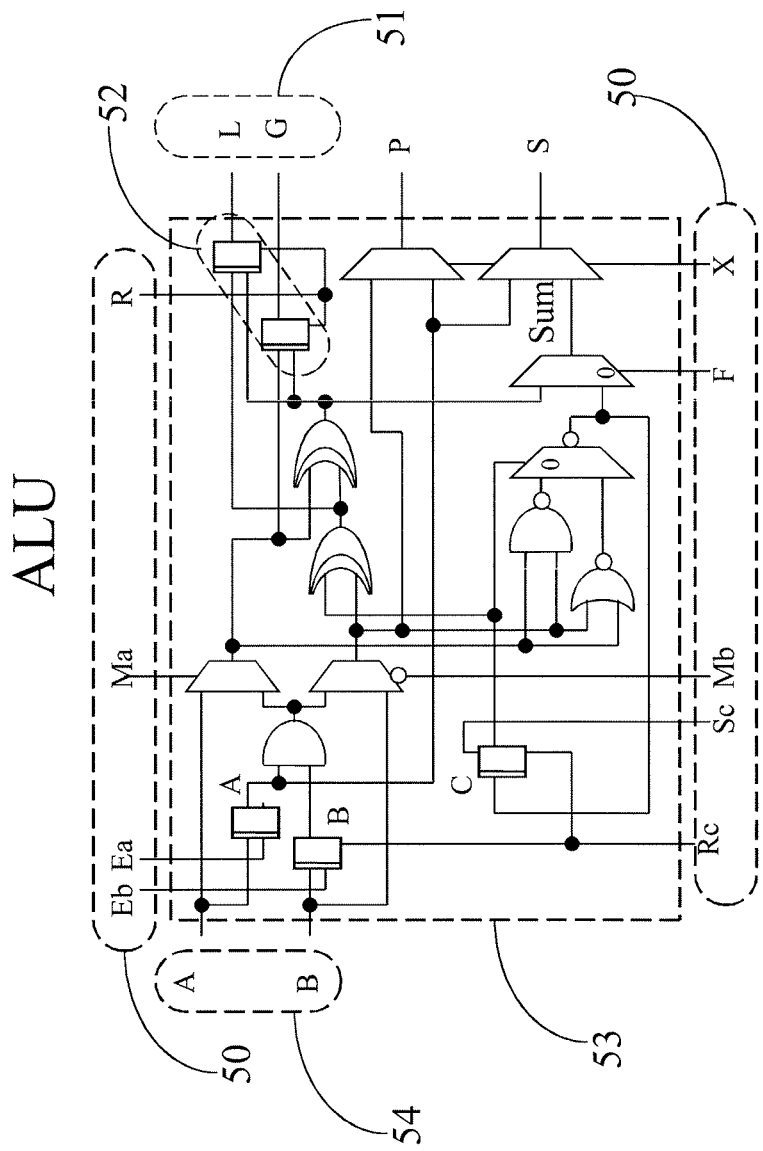
FIG. 5 is a diagram of a single bit ALU.

It is additionally contemplated that separate timing check logic, and separate counters, may be used to time the clocks for the ALU latches such as shown in FIG. 5 and FIG. 16. These counters would be enabled by transistors 184, but disabled by their own version of transistors 182.

It is further contemplated that an instruction for loading the I unit counter during timing cycles may be employed to limit the time needed to tune the execution unit's clocks for each configured operation.

As can be seen by the above descriptions, the product of the count in the I unit counter 89 in FIG. 24, and the count in the E unit counter 89 in FIG. 10, may be used to determine the amount of time, in base clock cycles, that a given configured execution unit operation will take to complete. The length of each execution unit clock cycle needed to complete each cycle of the configured operation may be determined by the count in the I unit counter 89 in FIG. 24. The clock for the execution unit may be formed by dividing a base clock frequency by the count from the I unit counter. The base clock frequency may be externally and/or internally generated, and may be temperature and/or process compensated. Furthermore, as can be seen from the above description, prior to the execution of each configured operation, this count may be either loaded from a previously simulated and compiled instruction or generated in the extra clock cycle prior to the execution of the configured instruction. In either case, the execution unit's clock delay may be individually tuned for each configured operation. On the other hand, the number of clock cycles needed to complete an execution unit operation may be determined by the E unit counter 89 in FIG. 10, which clocks the circular addressing 59 of the memory 55. This count may generally be a function of the precision and type of operation being performed. Combined, the clock delay times the number of clocks needed to complete each configured operation may be used to determine the total time necessary to complete the operation.

In yet another embodiment of the present invention logic may be included in the masked decoder to allow for logical operations on multiple masked addresses prior to loading the address registers.

Reference is again made to FIG. 12, the detailed logic of a masked decode. The masked decode logic allows groups of outputs 94 with the same bits of an address 92 that are not masked by the mask bits 93 to be selected. For example the 8 bit address 10011011 and 8 bit mask 00110001 selects all bits whose address matches 10xx1101x, where the x bits may be either 1 or 0. This type of decode makes it easy to select all the addresses in a contiguous group whose size is a power of 2 and begins on an address that is an even multiple of that size. For example the masked 8 bit address 0111xxxx selects all 16 words from address number 112 through number 127, where 112=7*16. Unfortunately this type of decode will not address a contiguous array that is neither a multiple of 2 in size nor starts at an address that is an even multiple of that size. In order to select all the elements in a contiguous array of an odd size or starting on an odd boundary it is necessary to logically combine multiple masked addresses.

Figure 25:
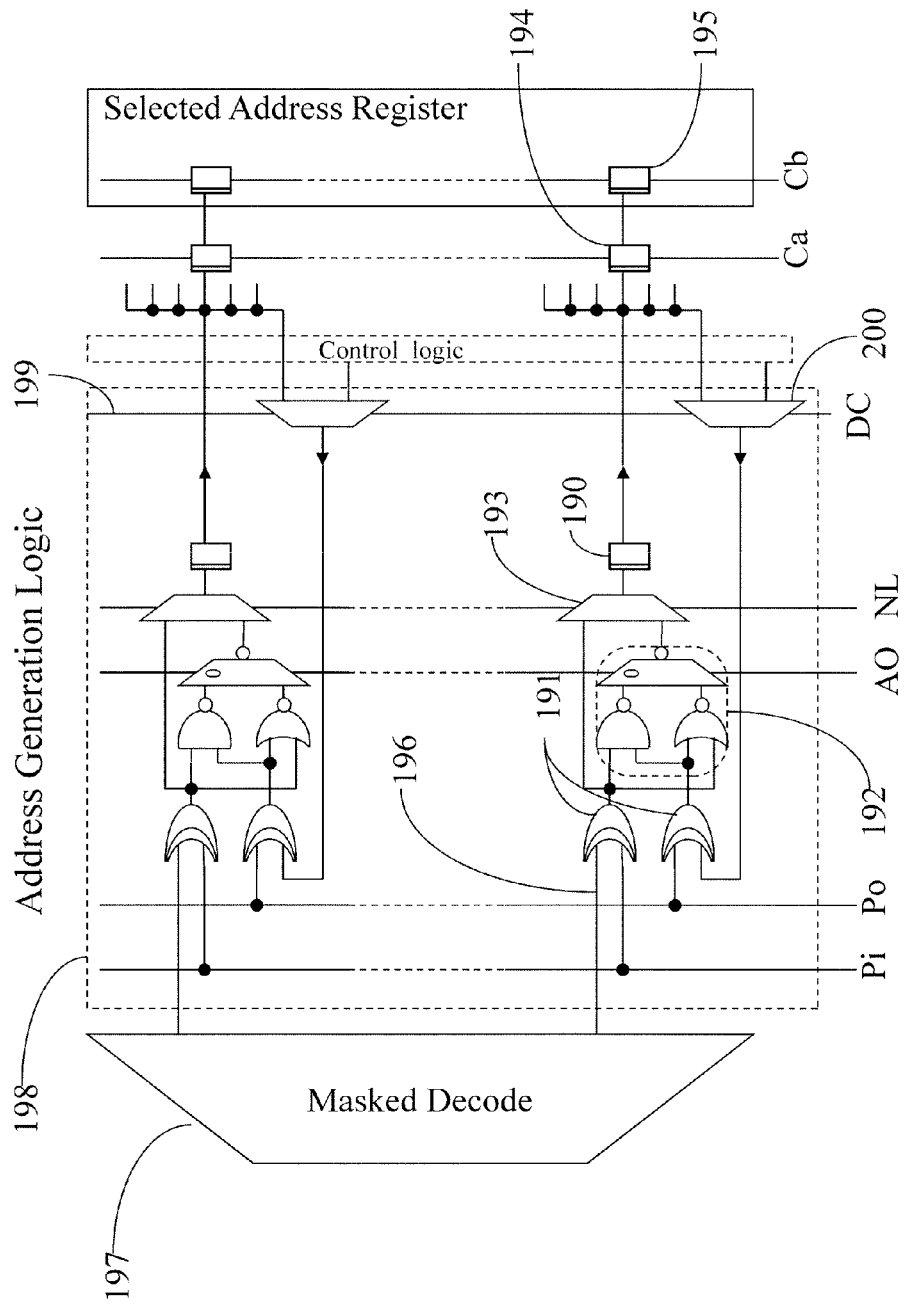
FIG. 25 is a diagram of combinatorial logic for the addresses.

Reference is now made to FIG. 25, a diagram of additional address generation logic appended to a masked decode. Typically, without the additional address generation logic 198, each output 196 from the masked decode 197 fans out directly to the eight pre-stage latches 194, one for each of the 8 address registers, each of which loads its respective latch 195 during the reset cycle. The additional address generation logic 198, for each bit, includes: a latch or flip-flop 190, for storing the results; a multiplexor 200 to select between the stored results and the control output of the ALUs to become the intermediate results; two XOR gates 191 for controlling the polarity of the intermediate results and the next mask decoded address; logic 192 for selecting the AND or OR of the intermediate results and the next decoded address; and a multiplexor 193 to select either the mask decoded address or a function of the next mask decoded address and the intermediate results to become the next results. With this additional logic any contiguous, or non-contiguous, group(s) of selected addresses may be generated by logically combining two or more masked addresses. For example, a contiguous group of 27 words beginning at address number 113, may be generated from three 8 bit masked addresses as follows: 0111xxxx AND (NOT 011111xx) AND (NOT 01110000). In other words, starting with a contiguous group of 32 words beginning at address 112, and eliminating the 4 words beginning at address 124 and then eliminating the word at address 112, a contiguous group of 27 words beginning at address 113 remain.

In yet another embodiment of the present invention a compiler may construct any desired contiguous set of N selected addresses out of $2^M$ possible addresses using $2*Int[\log_2 N]-2$ or less masked addresses, where Int[x] is the greatest integer less than or equal to x, by a) dividing the contiguous set of N selected addresses into an upper and lower subset about the address with the largest even power of 2 residing within the set, and for each subset, b) selecting a masked address that produces a primary group of addresses with the least differences from the subset, and c) selecting the masked address that produces the largest group of addresses that is within the primary group and outside of the subset, and if such a group exists, excluding the group from the primary group, d) selecting the masked address that produces the largest group of addresses that is within the subset and outside the primary group, and if such a group exists, including the group in the primary group, and e) repeating steps c and d until no groups exist.

To understand how this works, the address used to divide the set of N addresses into lower and upper subsets must be an address, which is a multiple of $2^K$, for some integer K, where $2^K<=N$. This is possible, because there are only $2^K-1$ addresses between addresses that are multiples of $2^K$, which is less than or equal to N. Now for the upper subset, any size contiguous subset whose size is a power of 2 up to $2^K$ can be created as was described above, and for the lower subset any subset of size $2^J$, where $J<=K$ must begin on $I*2^K-2^J=I*2^{K-J}*2^J-2^J=[I*2^{K-J}-1]*2^J$, which is a multiple of $2^J$, and can also be created. By similar logic any subsequent smaller group that is added to or deleted from these two subsets may also be generated.

Now since the group of N elements was divided into two groups, the differences between the masked address groups and the subgroups must be less than $2^K$ where $2^K<N<=2^{K+1}$, because the two groups combined would be at most be $2^{K+1}$ in size. Since the differences between the subgroups and masked address groups are contiguous groups and can be constructed by successively combining groups with 1 address to 2 addresses to 4 addresses, on up to $2^{K-1}$ addresses, which produces a group whose size is $2^K-1$ addresses, any difference from 1 address to $2^K-1$ addresses will be covered in no more than K−1 masked addresses. In other words any contiguous group of N addresses, where N<=2K+1 (i.e., Int[ $\log_2 N$ ]=K+1) may be constructed with no more than 2+2(K−1) masked addresses.

For example, assume N=250 locations, starting at address 121 and ending at 370. The selected address is $2^K=256$ or K=8. Now this creates two subsets, one between addresses 121 and 255, and the other between addresses 256 and 370. The first is covered by ORing a mask of the last 7 bits for 128 locations, starting at address 128 with 8 locations for 3 bits starting at address 120, and Exclusive ORing 1 element starting at address 120. The second is covered by ORing 128 locations beginning with address 256 to 64 locations starting at address 320, and then excluding 16 addresses starting at 368, ORing 4 addresses starting at 368, and excluding one address at 371. The process is complete when ORing the two subsets together. A total of 8 masked address operations were necessary to define this contiguous set of 250 elements, where 2*Int[ $\log_2(250)$]−2=14>8.

As was mentioned before, the instruction fetches and processing, including masked address decodes to configure the next operation, occur simultaneously with the serial computation. Since most computation will be between 16 and 32 bits in length, which is equivalent to between 16 and 32 clock cycles to perform, there are enough clock cycles to complete the masked address calculations described above, before the completion of the execution of the previous operation. On the other hand, there may not be sufficient clock cycles if the configuration of the next operation requires the results from the execution of the current operation. For example, a sort may be terminated when the results of a compare, such as described above results in no swapping of the compared values. The control logic 65 in FIG. 6 combines the results from the compare latches 52 in FIG. 5 for all the ALUs 66 in FIG. 6, which may be used to change the subsequent configuration. Unfortunately, the subsequent configuration instructions must then be processed while no execution is occurring. On the other hand, in most cases there are enough clock cycles during the execution of the compare to process not only the next configuration if a swap is needed, but to also process the next configuration when no swap is needed This "branch look-ahead" requires storing the preprocessed, decoded addresses for future instructions.

Figure 26:
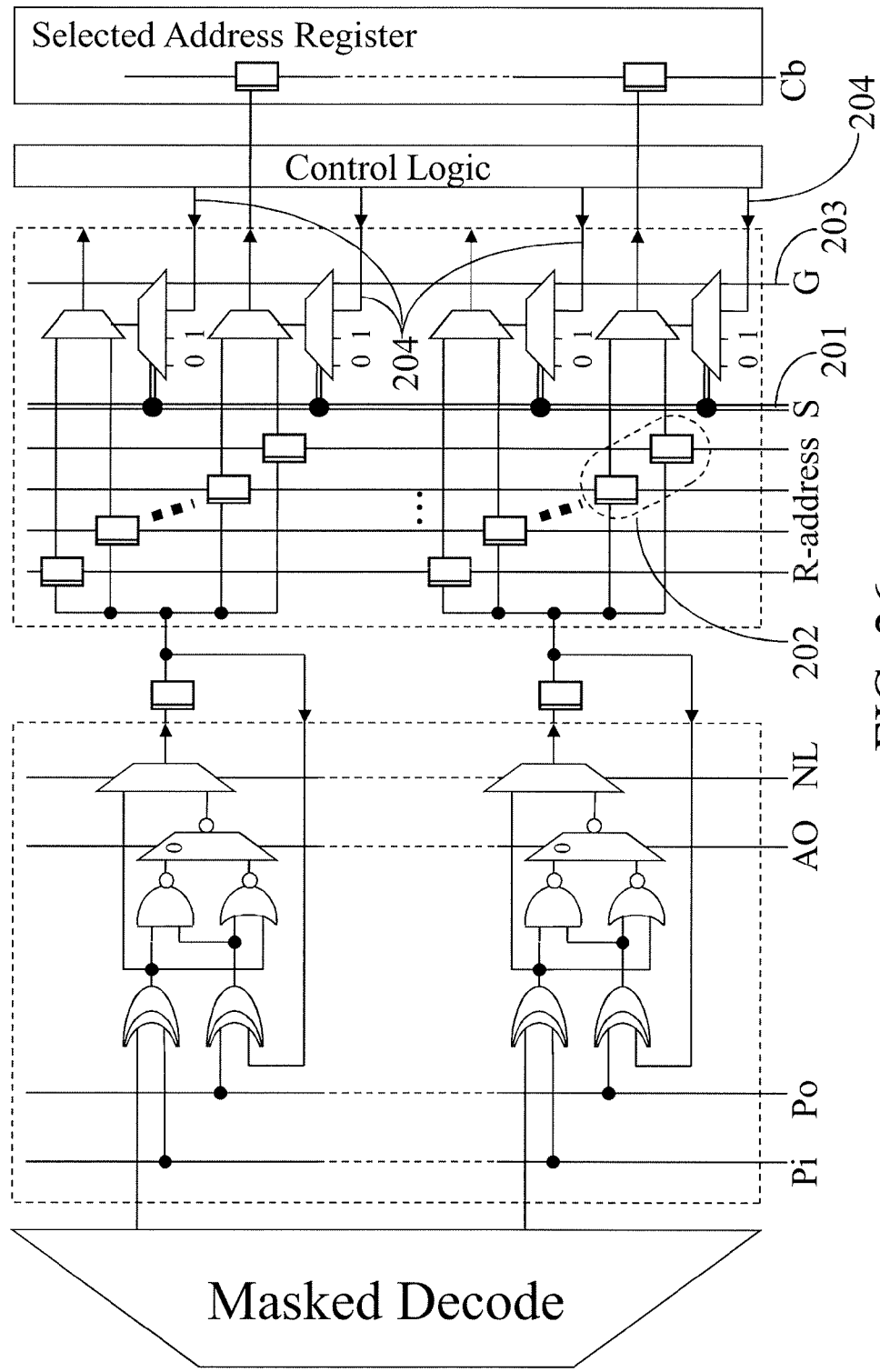
FIG. 26 is a diagram of look-ahead storage for the address registers.

Reference is now made to FIG. 26, a diagram of the masked decode with additional temporary storage. In this case each bit has multiple independently addressed latches or flip-flops 202 for storing the intermediate results of any masked decode computation such as was described above. If 2 bits are available for each address, they may be filled with the generated masked addresses for two separate operations. On a conditional configuration the Select inputs 201 select either the local compare results 204 from each ALU or the global compare results 203 from the control logic, both of which are a logical function of the ALU outputs 51, shown in FIG. 5. In this manner, the set of values for the correct configuration to be loaded at the next reset cycle of the execution unit based on the results of the current operation are selected. In this way conditional operations may be made completely transparent. For non-conditional configurations either bit may be directly selected. It is further contemplated that the conditional selection may be expanded to select among more than two configurations and to utilize both of the ALU outputs for the selection.

Furthermore it is contemplated that more efficient logic or higher performance logic may be substituted for the detailed logic presented in this example of a serial array processor, and different types of memory cells, such as Static Random access Memory (SRAM) cells, Programmable Read-only Memory (PROM) cells or a combination of both may be used in conjunction with the implementation of the 2 port orthogonal memory, or that two separate memories accessed in an orthogonal fashion may be used, with the I/O unit reading and writing the data into the "data memory" for the execution unit in a serial fashion, while writing and reading the data into the "instruction memory" in a parallel fashion. It is also contemplated that such "data memory" and "instruction memory" may be cache memory, in which case the "data memory" is a 2 port orthogonal memory, with a parallel port to the external world, and the serial port connected to the execution unit. It is also contemplated that the I/O unit may contain multiple DMA subsystems which independently read and write "data memory" through the parallel port of separate banks of memory while the orthogonal serial port is being accessed by the execution unit on the same memory. Other similar extensions to fit this serial array processor architecture into the environment of existing single instruction single data path processors are also contemplated.

From these examples and options it should be clear that the configuration instructions processed by the I-unit logic shown in FIG. 10 create the configuration for the next operation. As described above each instruction contains fields for the operation code, the target identification, the Address and the Mask data. The instructions fall into one of two basic groups: execution instructions and configuration instructions. The I-unit processes configuration instructions to configure the next E Unit operation. Execution instructions define and initiate the subsequent operations and configurations. In this processor, a program is a series of configured operations, where each operation is defined by a group of instructions, each of which consists of zero to many configuration instructions followed by at least one execution instruction. The I-unit stalls all subsequent configuration instructions in the next group until all the execution instructions in the current group have been initiated, which does not occur until the E Unit or the selected portion of the I/O completes its current operation.

The operation codes of configuration instructions include logical operations on a combination of the address register specified by the target identification and the decoded address generated from the contents of the Address and Mask fields. The target identification specifies an address register including the intermediate results and all conditionally selectable copies. The configuration instructions for any given operation or set of conditional operations may generally reside in contiguous locations in the instruction memory and may generally be followed by at least one execution instruction.

The operation codes for execution instructions include options for initiating I/O operations, E-Unit operations and processing subsequent configuration operations. For I/O operations, the execution instructions include options for reading, writing, locking, writing following reading, and other I/O operations. The target identification field contains the DMA subsystem, or initialization register set address, while the address and mask fields contain the memory address and length of transfer, or the contents to be put in the initialization registers. An option may also exist to select the next available DMA subsystem. For E-Unit operations, execution codes include options for either selecting specific address registers for the next operation, or selecting the address registers based on the currently executing operation's local or global compare results. The target identification field contains the number of clock cycles to complete the operation, which may generally be equivalent to the precision of the arithmetic operation. If compiled, the Mask field may contain the clock count for the subsequent operation. For some execution instructions, the Address field may contain the absolute or conditional address of the next group of instructions, based on the global compare results from the prior operation. When processed by the I-unit, these addresses constitute absolute or conditional branches into the code.

Following a sequence of configuration instructions, one or more execution instructions may be processed, to determine the subsequent execution, which will commence upon the completion of each respective unit's current operation and the processing of the prior configuration and execution instructions. After all the execution instructions have been processed, such that the current I/O and E-Unit operations have been initiated, the I-unit will commence with decoding and processing configuration instructions in the next group for the subsequent operation. For example, if an I/O operation is processed, which requires a DMA unit that is currently active, the I-unit will stall until the requested I/O operation is initiated. Similarly, the I-unit will stall while processing an E-unit execution instruction, until the current E-Unit operation has completed.

As such, in yet another embodiment of the current invention, multiple configuration instructions may be processed during the serial execution of a current operation being performed concurrently on a plurality of selected data through a plurality of configurable functional units.

Figure 27:
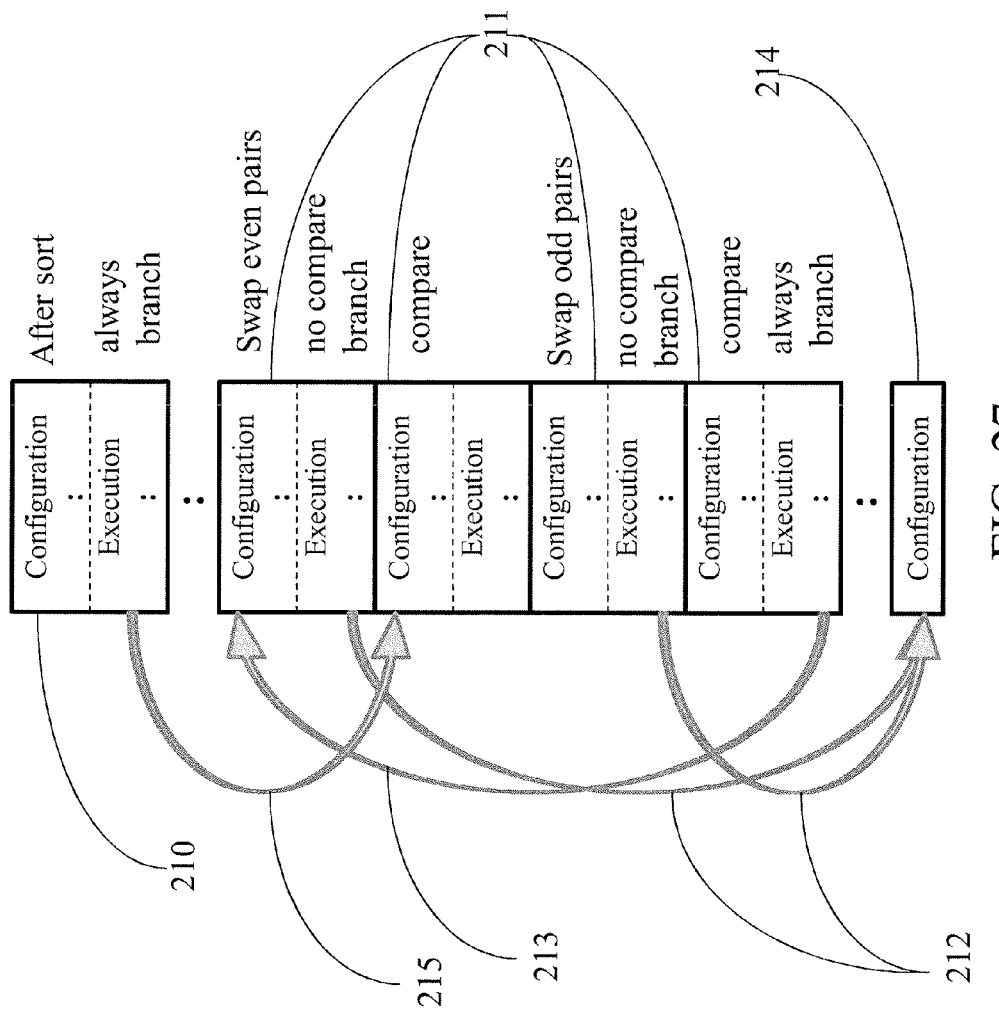
FIG. 27 is a diagram of instruction code for a sort.

Reference is now made to FIG. 27, a diagram of the instruction code for the sort shown in FIG. 20 and discussed above. Such a sort using the array processor may include the following:

Compare all pairs of values starting with the $1^{st}$ location;
Conditionally swap all pairs starting with the $1^{st}$ location;
Compare all pairs of values starting with the $2^{nd}$ location;
Conditionally swap all pairs starting with the $2^{nd}$ location;
If any swaps occurred, repeat.

As such there are four groups of code 211, each comprising configuration instructions and at least one execution instruction, for the above four operations listed above. To begin, one may branch 215 into the loop. To repeat the above steps, the figure includes branch 213 back to the beginning operation. To exit the algorithm, the figure provides conditional branches 212 out of the loop if no compares have occurred. These branches occur in the execution instruction of the swap operations because the code branches only occur based on the current compare results and, as was described above, the execution instruction initiates the next operation. To ensure the sorting only exits after it is complete, the compare steps may generally include the comparison of both odd and even pairs, but only odd or even swapping may subsequently occur. Finally, in addition to conditionally branching, the execution instructions for the swap operations may also conditionally configure the operation so that when the loop is exited, the next operation executed is the after-sort operation, which was processed into the conditional address registers by the group 210, processed prior to entering the loop. As such, when properly coded, after initially configuring the array, subsequent operations need not wait on the processing of their configurations.

Figure 28:
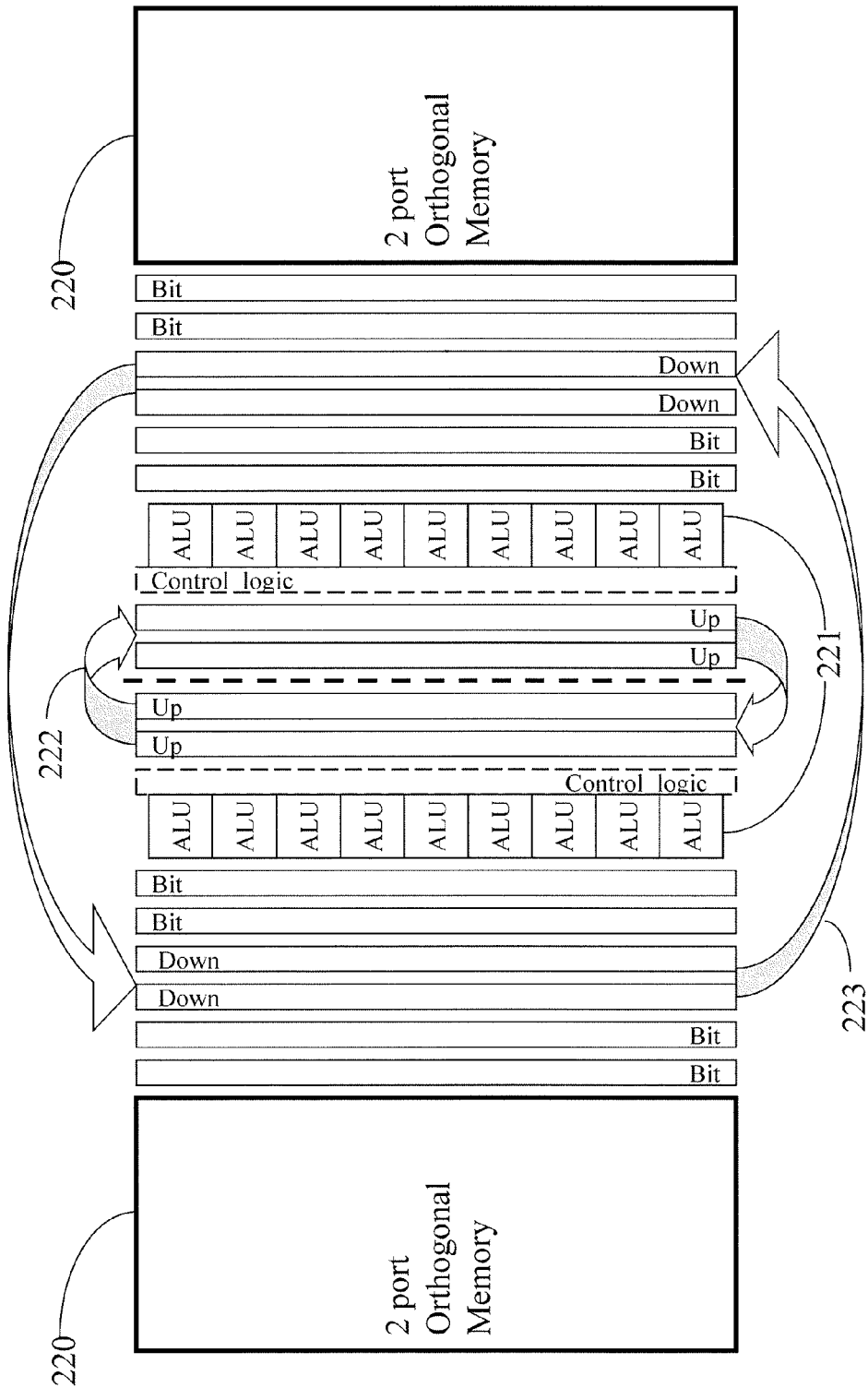
FIG. 28 is a diagram of another version of the array processor's execution unit.

Reference is now made to FIG. 28, another example of the array processor's execution unit according to an embodiment of the invention. In this case, FIG. 28 shows two separate orthogonal memory banks 220 and two columns of ALUs 221. In a fashion, similar to the previous example, the outputs from the ALUs may be connected to the up multiplexors, which may be connected in a clockwise circular ring 222. Similarly, the down multiplexors may be connected in a counter-clockwise circular ring 223. Lastly, the bit multiplexors may connect both columns of ALUs 221 to both memory banks 220. In this fashion, sorting algorithms may move data back and forth from one bank to the other, which may make packing and memory use more efficient.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. An operation unit to perform a series of operations, each requiring a plurality of execution clock cycles, the operation unit including:
   a plurality of configurable serial data paths; and
   at least one memory;
      wherein, for each respective operation of the series of operations, the serial data paths are configured for the respective operation prior to a first timing clock cycle, and wherein the respective operation is subsequently executed over the plurality of execution clock cycles required for the respective operation, and
      wherein the timing clock cycle is used to determine a shortest execution unit clock cycle.

2. The operation unit as in claim 1, further including configurable logic units;
   wherein, for each respective operation of the series of operations, the configurable logic units are configured prior to the first timing clock cycle to propagate at least one signal transition through a longest configured serial data path of the respective operation during the first timing clock cycle.

3. The operation unit as in claim 2, further including check logic;
   wherein the check logic is used during the first timing clock cycle of each respective operation to measure and set respective delays of each of the plurality of execution clock cycles to equal a delay of at least one signal transition through a longest configured serial data path.

4. The operation unit as in claim 3, wherein the respective delay for each respective one of the plurality of execution clock cycles is determined by measuring a number of base clock pulses needed to propagate at least one signal transition through the longest configured serial data path.

5. The operation unit as in claim 1, wherein a maximum number of base clock pulses has a greater duration than a longest possible serial data path delay in the operation unit.

6. The operation unit as in claim 2, wherein, for each respective operation of the series of operations, the configurable logic units are reconfigured following each timing clock cycle to perform the respective operation during the plurality of subsequent execution clock cycles required for the respective operation.

* * * * *